(12) United States Patent
Singh et al.

(10) Patent No.: US 12,199,181 B2
(45) Date of Patent: Jan. 14, 2025

(54) SEMICONDUCTOR STRUCTURE AND METHOD FOR MANUFACTURING THE SAME

(71) Applicant: TAIWAN SEMICONDUCTOR MANUFACTURING COMPANY, LTD., Hsinchu (TW)

(72) Inventors: Gulbagh Singh, Hsinchu (TW); Kun-Tsang Chuang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/361,585

(22) Filed: Jul. 28, 2023

(65) Prior Publication Data

US 2023/0378347 A1     Nov. 23, 2023

Related U.S. Application Data

(62) Division of application No. 17/162,161, filed on Jan. 29, 2021.

(51) Int. Cl.
*H01L 29/78* (2006.01)
*H01L 29/10* (2006.01)
*H01L 29/66* (2006.01)

(52) U.S. Cl.
CPC ...... *H01L 29/7824* (2013.01); *H01L 29/1095* (2013.01); *H01L 29/66681* (2013.01)

(58) Field of Classification Search
CPC ............. H01L 29/7824; H01L 29/1095; H01L 29/66681; H01L 29/66772; H01L 29/78654; H01L 29/78615; H01L 29/78; H01L 29/0649; H01L 29/0684; H01L 29/0607; H01L 29/0696; H01L 29/0843; H01L 29/0865–0869; H01L 29/0882–0886; H01L 29/0891; H01L 29/1029–1058; H01L 29/41758; H01L 29/42312–42396; H01L 29/49–518; H01L 29/66598; H01L 29/66636; H01L 29/66643; H01L 29/66651; H01L 29/66659; H01L 29/435; H01L 29/66848;

(Continued)

(56) References Cited

U.S. PATENT DOCUMENTS 5,185,280 A  *  2/1993  Houston ........... H01L 29/66772
                                                    438/164
5,684,318 A  *  11/1997  Ayres ................ H01L 29/78696
                                                    257/334

(Continued)

*Primary Examiner* — Natalia A Gondarenko
(74) *Attorney, Agent, or Firm* — Birch, Stewart, Kolasch & Birch, LLP

(57) ABSTRACT

A semiconductor structure includes a substrate assembly and a semiconductor device. The semiconductor device is formed on the substrate assembly, and includes a body region, two active regions, and a butted body. The active regions are disposed at two opposite sides of the body region, and both have a first type conductivity. The body region and the active regions together occupy on a surface region of the substrate assembly. The butted body has a second type conductivity different from the first type conductivity, and is located on the surface region of the substrate assembly so as to permit the body region to be tied to one of the active regions through the butted body.

20 Claims, 31 Drawing Sheets

(58) Field of Classification Search
CPC ............. H01L 29/8126; H01L 29/7841; H01L 29/4238; H01L 29/7725; H01L 29/775; H01L 29/778; H01L 29/7833–7836; H01L 29/8615; H01L 29/78624; H01L 29/78696; H01L 27/11553; H01L 27/1158; H01L 27/1203; H01L 27/14616
USPC .................... 257/335, 347, 57, 66, 349, 348
See application file for complete search history.

(56) References Cited

U.S. PATENT DOCUMENTS

| | | | |
|---|---|---|---|
| 5,929,490 | A | 7/1999 | Onishi |
| 6,452,233 | B1 * | 9/2002 | Masuda ............ H01L 29/78609 |
| | | | 257/349 |
| 6,605,843 | B1 | 8/2003 | Krivokapic et al. |
| 7,176,527 | B2 | 2/2007 | Fukuda |
| 7,804,132 | B2 | 9/2010 | Hirano |
| 8,901,537 | B2 | 12/2014 | Murthy et al. |
| 2006/0049467 | A1 | 3/2006 | Lim et al. |
| 2012/0112280 | A1 | 5/2012 | Johnson et al. |

* cited by examiner

SEMICONDUCTOR STRUCTURE AND METHOD FOR MANUFACTURING THE SAME

REFERENCE TO RELATED APPLICATION

This application is a divisional application of U.S. patent application Ser. No. 17/162,161, filed on Jan. 29, 2021, the contents of which is incorporated herein by reference in its entirety.

BACKGROUND

A Silicon-On-Insulator (SOI) transistor generally refers to a semiconductor device overlying an insulator layer on a semiconductor substrate, and provides improved performances (e.g. lower leakage, higher packing density, etc.) due to excellent lateral and vertical isolations of the semiconductor device from the substrate.

SOI transistors may include partially-depleted (PD) SOI transistors and fully-depleted (FD) SOI transistors. Compared with the FD SOI transistors, the PD SOI transistors are simpler for manufacturing. However, because the PD SOI transistors may have a maximum depletion width smaller than a body thickness thereof, they may have a floating body which may result in kink effect, impact ionization, a worse subthreshold swing, a lower drain to source breakdown voltage, and so on.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
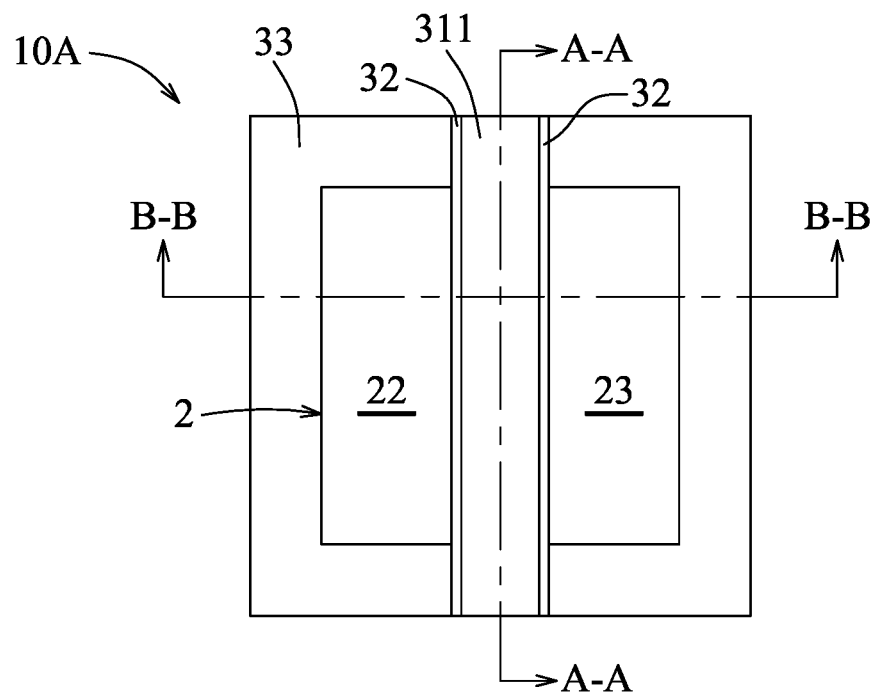
FIGS. 1 to 16 are schematic views illustrating semiconductor structures in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "lower," "upper," "beneath," "over," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
Figure 3:
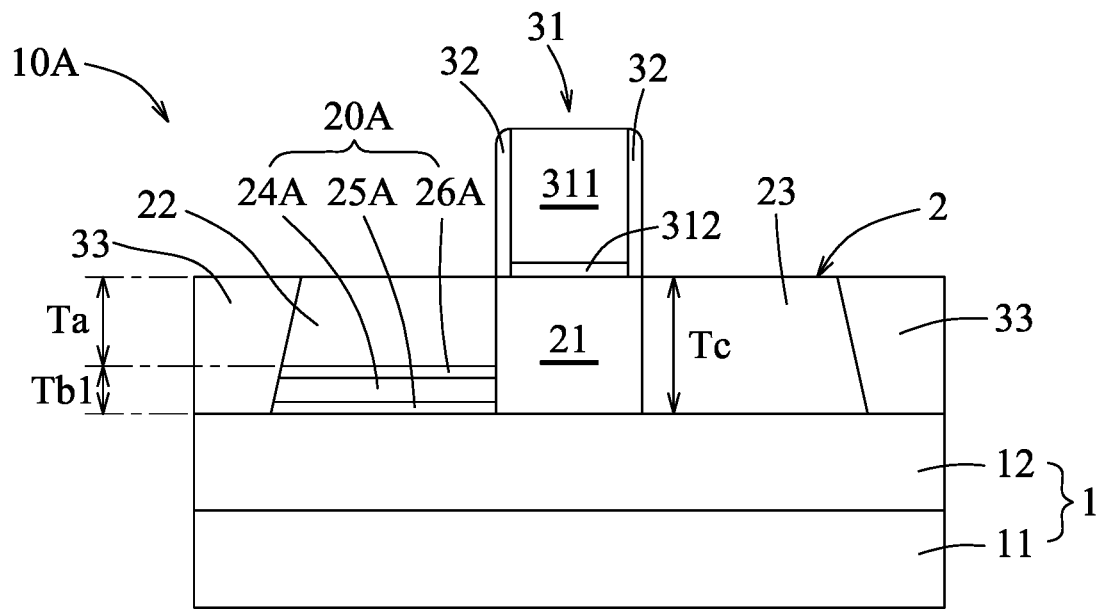

FIG. 1 illustrates a schematic top view of a semiconductor structure 10A in accordance with some embodiments. FIGS. 2 and 3 illustrate schematic cross-sectional views taken along A-A and B-B lines of FIG. 1, respectively. The semiconductor structure 10A includes a substrate assembly 1, a semiconductor device 2, a gate stack 31, and two spacers 32, and a shallow trench isolation (STI) region 33. The substrate assembly 1 may be a part of, for example, but not limited to, an SOI (silicon-on-insulator) substrate, an SOS (silicon-on-sapphire) substrate, or other suitable substrates. The substrate assembly 1 may include a substrate 11 and an insulating layer 12 (e.g., a buried oxide layer (BOX)). The substrate 11 may include a semiconductor material, such as, but not limited to, single crystalline silicon, polycrystalline silicon, amorphous silicon, other suitable materials, or combinations thereof. The insulator layer 12 may include an insulator material such as, but not limited to, silicon oxide, silicon nitride, sapphire, other suitable materials, or combinations thereof. The semiconductor device 2 may be formed on the insulating layer 12 of the substrate assembly 1 and may include a body region 21, two active regions 22, 23, a butted body 24A, a lower buffer layer 25A, and an upper buffer layer 26A. Each of the body region 21, the active regions 22, 23, the butted body 24A, the lower buffer layer 25A, and the upper buffer layer 26A may include a semiconductor material independently selected from, for example, but not limited to, single crystalline silicon, polycrystalline silicon, SiGe, SiP, other suitable materials, or combinations thereof. The active regions 22, 23 are disposed at two opposite sides of the body region 21, and both have a first type conductivity. The body region 21 and the active regions 22, 23 together occupy a surface region of the substrate assembly 1. In some embodiments, the active region 22 may serve as a source region, the active region 23 may serve as a drain region, and the body region 21 may define a channel region, although they are not so limited. The butted body 24A has a second type conductivity different from the first type conductivity, and is located on the surface region of the substrate assembly 1 so as to permit the body region 21 to be tied to the active region 22. In some embodiments, the butted body 24A may be located between the insulating layer 12 and the active region 22 and has a junction with the body region 21 so as to permit the body region 21 to be tied to the active region 22 through the butted body 24A. The lower buffer layer 25A may be located between the insulating layer 12 and the butted body 24A. The upper buffer layer 26A may be located between the butted body 24A and the active region 22.

The gate stack 31 is disposed on the body region 21 opposite to the substrate assembly 1, and may include a gate electrode 311 and a gate dielectric 312 disposed between the gate electrode 311 and the body region 21. The spacers 32 are disposed on two opposite sidewalls of the gate stack 31, and each of the spacers 32 may have one or more material layers. The STI region 33 is disposed on the insulating layer 12 to surround the semiconductor device 2 so as to isolate the semiconductor device 2 from other device (not shown). The gate electrode 311 may include, but not limited to, polysilicon, metal, other suitable materials, or combinations thereof. Each of the gate dielectric 312, the spacers 32, the STI region 33 may include a material independently selected from, for example, but not limited to, silicon oxide, silicon nitride, silicon oxynitride, high dielectric constant (k) materials, other suitable materials, or combinations thereof.

In some embodiments, the body region 21 may have an impurity of the second type conductivity in a lower concentration than that of the butted body 24A, and hence may be intrinsic (i.e., a non-doped region) or a region of the second type conductivity.

In some embodiments, each of the lower buffer layer 25A and the upper buffer layer 26A may independently be a non-doped region or a region of the second type conductivity.

In some embodiments, the semiconductor device 2 may be an n-type semiconductor device. To be specific, both the active regions 22, 23 may be doped with an n-type impurity to have an n-type conductivity, and the butted body 24A may be doped with a p-type impurity to have a p-type conductivity. The n-type impurity may be, for example, but not limited to, phosphorous, nitrogen, arsenic, antimony, other suitable materials, or combinations thereof. The p-type impurity may be, for example, but not limited to, boron, aluminum, gallium, indium, $BF_2$, other suitable materials, or combinations thereof. In addition, the body region 21 may have a p-type impurity in a lower concentration than that of the butted body 24A, and hence may be non-doped or have a p-type conductivity. Each of the lower buffer layer 25A and the upper buffer layer 26A may independently be intrinsic (i.e., non-doped) or have a p-type conductivity. In an example of an n-type SOI MOSFET, each of the active regions 22, 23 may include an n-doped material (such as, but not limited to, silicon phosphide (SiP) or other suitable materials), the butted body 24A may include a p-doped material (such as, but not limited to, silicon germanium (SiGe) or other suitable materials), the body region 21 may be a non-doped or p-doped region in which a concentration of the p-type impurity is lower than that of the butted body 24A, and each of the lower buffer layer 25A and the upper buffer layer 26A may include such as, but not limited to silicon or other suitable materials. The body region 21 may have the p-type conductivity through an ion implantation process.

In some embodiments, the semiconductor device 2 may be a p-type semiconductor device. To be specific, both the active regions 22, 23 may be doped with the p-type impurity (described above) to have a p-type conductivity, and the butted body 24A may be doped with the n-type impurity (described above) to have an n-type conductivity. In addition, the body region 21 may have an n-type impurity in a lower concentration than that of the butted body 24A, and hence may be intrinsic (i.e., non-doped) or have an n-type conductivity. Each of the lower buffer layer 25A and the upper buffer layer 26A may independently be intrinsic (i.e., non-doped) or have an n-type conductivity. In an example of a p-type SOI MOSFET, each of the active regions 22, 23 may include a p-doped material (such as, but not limited to, silicon germanium (SiGe) or other suitable materials), the butted body 24A may include an n-doped material (such as, but not limited to, silicon phosphide (SiP) or other suitable materials), the body region 21 may be a non-doped or n-doped region in which a concentration of the n-type impurity is lower than that of the butted body 24A, and each of the lower buffer layer 25A and the upper buffer layer 26A may include, such as, but not limited to, silicon or other suitable materials. The body region 21 may have the n-type conductivity through an ion implantation process.

In some embodiment, to ensure that the semiconductor structure 10A can function as a MOS transistor, a thickness (Ta) of the active region 22 may range from about 50% to about 95% of a thickness (Tc) of the body region 21, and a thickness (Tb1) of a stack 20A composed of the butted body 24A, the lower buffer layer 25A, and the upper buffer layer 26A may range from about 5% to about 50% of the thickness (Tc) of the body region 21. In alternative embodiments, a slightly higher or lower range of the thickness (Ta) or (Tb1) may be used, depending on the design or the device performance of the semiconductor structure. A sum of Ta and Tb1 may be smaller than, equal to, or larger than Tc, and a difference between Tc and the sum of Ta and Tb1 may be kept smaller than about 10% of Tc.

Figure 4:
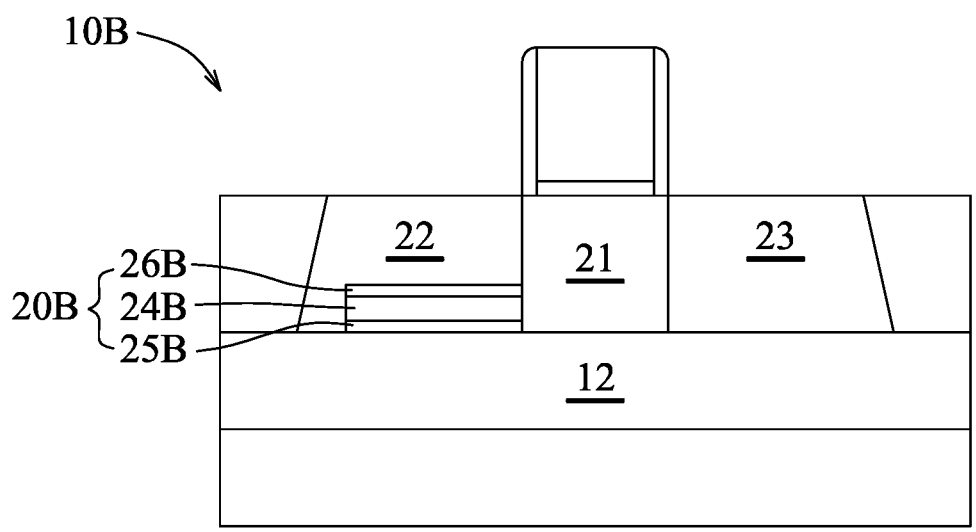

FIG. 4 illustrates a cross-sectional view of a semiconductor structure 10B in accordance with some embodiments. The semiconductor structure 10B is similar to the semiconductor structure 10A except that the semiconductor structure 10B may include a stack 20B composed of a butted body 24B, a lower buffer layer 25B, and an upper buffer layer 26B. The butted body 24B, the lower buffer layer 25B, and the upper buffer layer 26B of the stack 20B are similar to the butted body 24A, the lower buffer layer 25A, and the upper buffer layer 26A of the stack 20A. However, compared to the stack 20A, the stack 20B may have a reduced dimension in a width or length direction thereof as long as the butted body 24B has a junction with the body region 21. The width or length direction of the stack 20B may be transverse to a thickness direction thereof.

Figure 5:
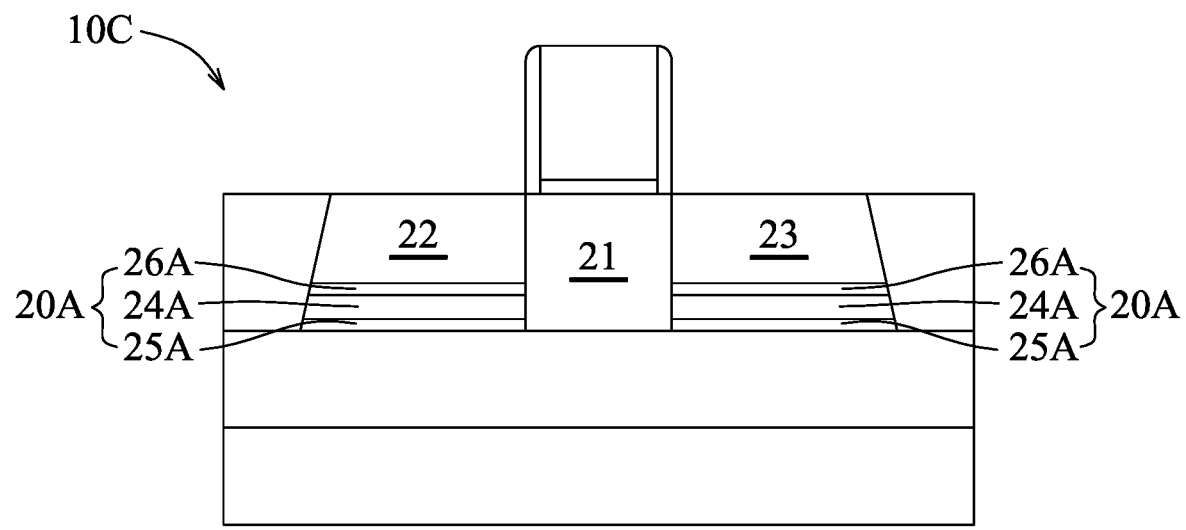

FIG. 5 illustrates a cross-sectional view of a semiconductor structure 10C in accordance with some embodiments. The semiconductor structure 10C is similar to the semiconductor structure 10A except that the semiconductor structure 10C may include two of the stacks 20A each of which is located between the insulating layer 12 and a respective one of the active regions 22, 23. To serve as a MOS transistor, one of the active regions 22, 23 may function as a source region, the other of the active regions 22, 23 may function as a drain region, and the body region 21 may define a channel region, although they are not so limited.

Figure 6:
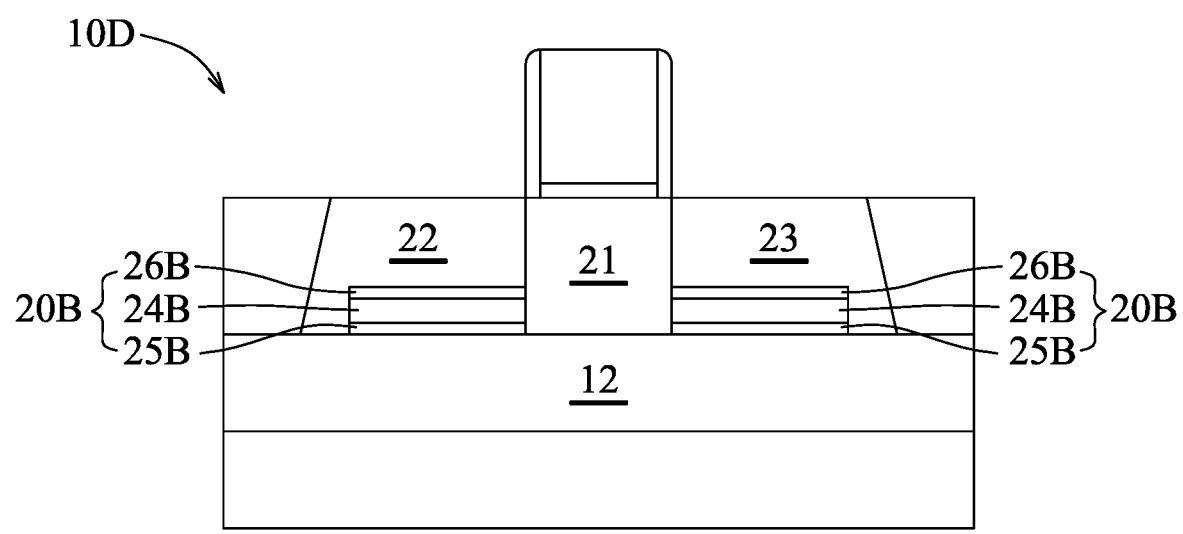

FIG. 6 illustrates a cross-sectional view of a semiconductor structure 10D in accordance with some embodiments. The semiconductor structure 10D is similar to the semiconductor structure 10B except that the semiconductor structure 10D may include two of the stacks 20B each of which is located between the insulating layer 12 and a respective one of the active regions 22, 23. To serve as a MOS transistor, one of the active regions 22, 23 may function as a source region, the other of the active regions 22, 23 may function as a drain region, and the body region 21 may define a channel region, although they are not so limited.

Figure 7:
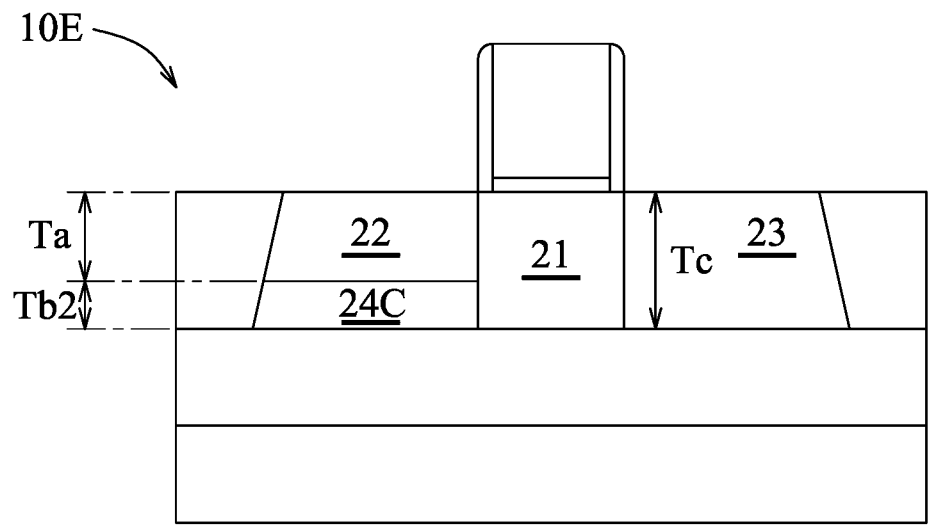

FIG. 7 illustrates a cross-sectional view of a semiconductor structure 10E in accordance with some embodiments. The semiconductor structure 10E is similar to the semiconductor structure 10A except that the semiconductor structure 10E may include a butted body 24C in replacement of the stack 20A of the semiconductor structure 10A. The butted body 24C is similar to the butted body 24A.

In some embodiments, to ensure that the semiconductor structure 10E can function as a MOS transistor, a thickness (Ta) of the active region 22 may range from about 50% to about 95% of a thickness (Tc) of the body region 21, and a thickness (Tb2) of the butted body 24C may range from about 5% to about 50% of the thickness (Tc) of the body region 21. In alternative embodiments, a slightly higher or lower range of the thickness (Ta) or (Tb2) may be used, depending on the design or the device performance of the semiconductor structure. A sum of Ta and Tb2 may be smaller than, equal to, or larger than Tc, and a difference between Tc and the sum of Ta and Tb2 may be kept smaller than about 10% of Tc.

Figure 8:
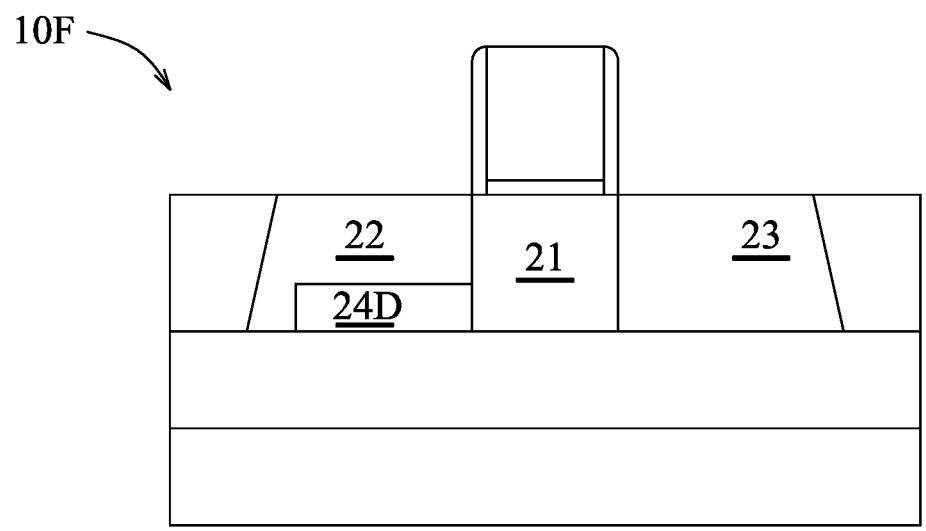

FIG. 8 illustrates a cross-sectional view of a semiconductor structure 10F in accordance with some embodiments. The semiconductor structure 10F is similar to the semiconductor structure 10E except that the semiconductor structure 10F may include a butted body 24D which is similar to the butted body 24C. However, compared to the butted body 24C, the butted body 24D may have a reduced dimension in a width or length direction thereof as long as the butted body 24D has a junction with the body region 21. The width or length direction of the butted body 24D may be transverse to a thickness direction thereof.

Figure 9:
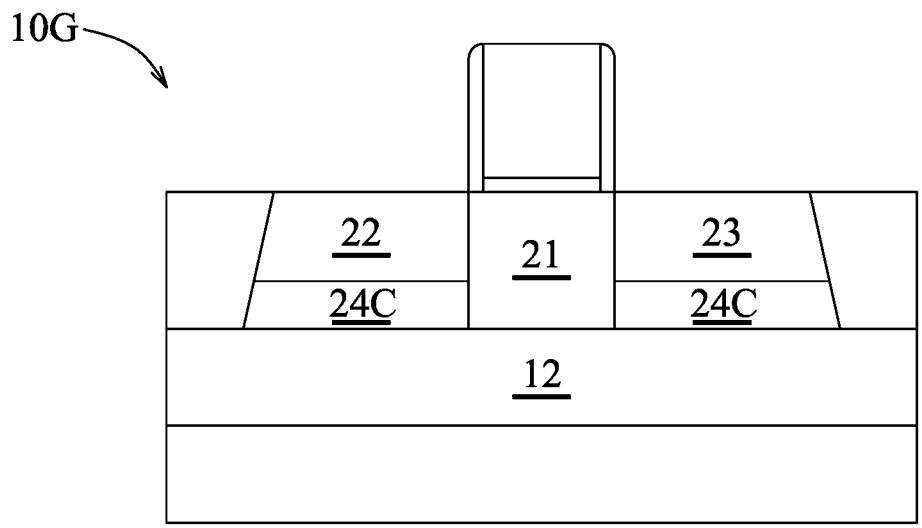

FIG. 9 illustrates a cross-sectional view of a semiconductor structure 10G in accordance with some embodiments. The semiconductor structure 10G is similar to the semiconductor structure 10E except that the semiconductor structure 10G may include two of the butted bodies 24C each of which is located between the insulating layer 12 and a respective one of the active regions 22, 23. To serve as a MOS transistor, one of the active regions 22, 23 may function as a source region, the other of the active regions 22, 23 may function as a drain region, and the body region 21 may define a channel region, although they are not so limited.

Figure 10:
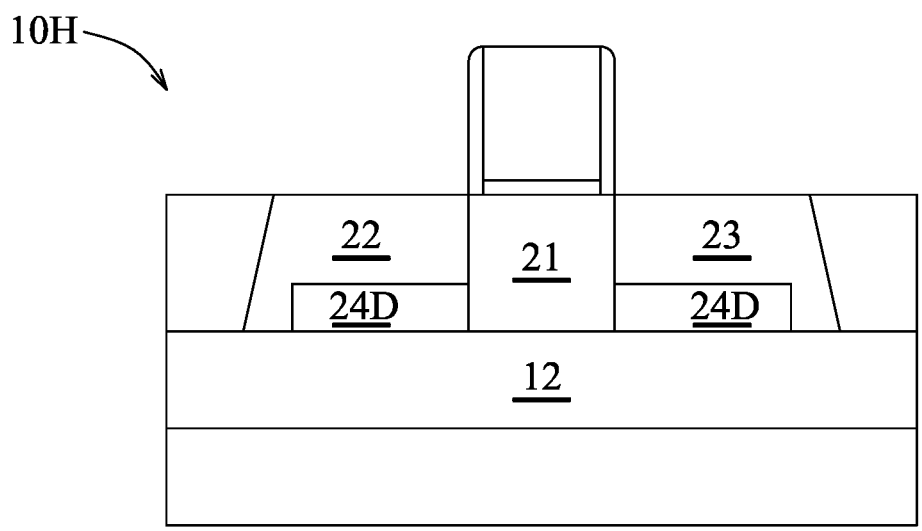

FIG. 10 illustrates a cross-sectional view of a semiconductor structure 10H in accordance with some embodiments. The semiconductor structure 10H is similar to the semiconductor structure 10F except that the semiconductor structure 10H may include two of the butted bodies 24D each of which is located between the insulating layer 12 and a respective one of the active regions 22, 23. To serve as a MOS transistor, one of the active regions 22, 23 may function as a source region, the other of the active regions 22, 23 may function as a drain region, and the body region 21 may define a channel region, although they are not so limited.

In some embodiments, each of the body region 21, the gate electrode 311, and the gate dielectric 312 of each of the semiconductor structures 10A-10H may be in a substantially strip form. In alternative embodiments, each of the body region 21, the gate electrode 311, and the gate dielectric 312 of each of the semiconductor structures 10A-10H may be in other suitable form, such as, but not limited to, a substantially T-shaped form, a substantially H-shaped form, or other suitable forms.

With the provision of the butted body (or butted bodies) 24A, 24B, 24C, or 24D in the semiconductor structure of the disclosure, the semiconductor structure of the disclosure is less likely to have a floating body. In addition, because the butted body (or the butted bodies) for tying the body region 21 to the active region(s) 22 and/or 23 may be provided beneath the active region(s) 22 and/or 23, the semiconductor structure of the disclosure may be provided for eliminating the floating body effect without increasing a device area thereof.

Figure 11:
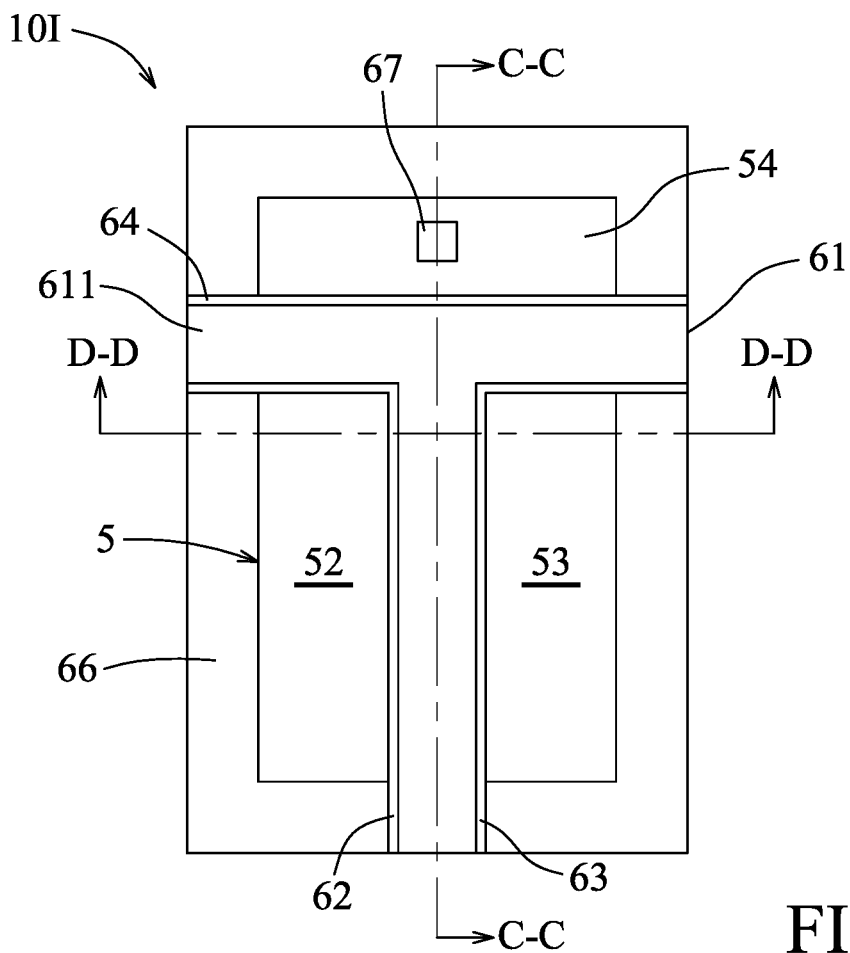
Figure 12:
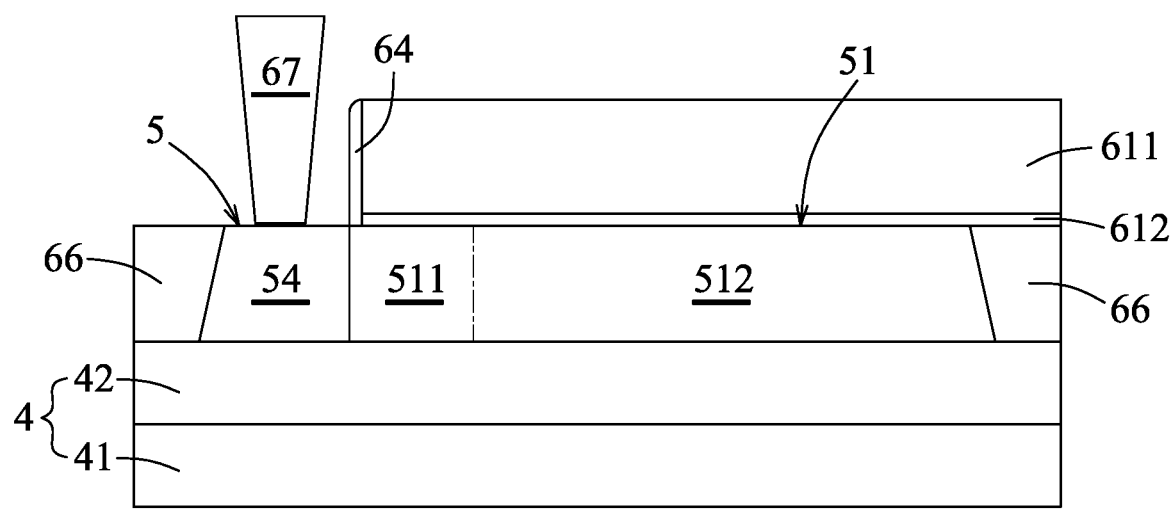
Figure 13:
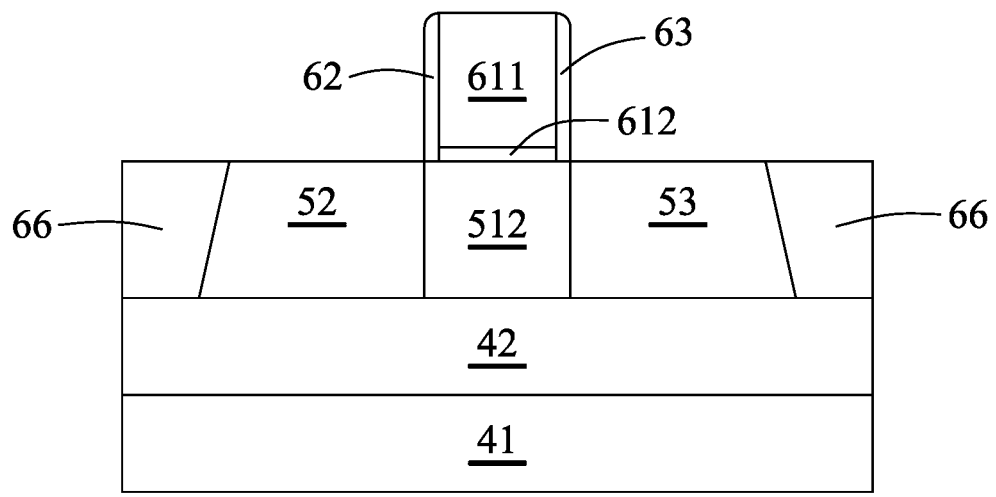

FIG. 11 illustrates a schematic top view of a semiconductor structure 10I in accordance with some embodiments. FIGS. 12 and 13 illustrate schematic cross-sectional views taken along C-C and D-D lines of FIG. 11, respectively. The semiconductor structure 10I is similar to the semiconductor structure 10E except that a position of a butted body. The semiconductor structure 10I includes a substrate assembly 4, a semiconductor device 5, a gate stack 61, three spacers 62, 63, 64, and a shallow trench isolation (STI) region 66. The substrate assembly 4 may include a substrate 41 and an insulating layer 42. The semiconductor device 5 may be formed on the insulating layer 42 and may include a body region 51, two active regions 52, 53, and a butted body 54. The body region 51 may be in a generally T-shaped form, and may include a first body area 511 and a second body area 512. The first body area 511 separates the butted body 54 from the active regions 52, 53. The second body area 512 extends transversely to the first body area 511 and separates the active regions 52, 53 from each other. Both the active regions 52, 53 may have the first type conductivity (as described above). The butted body 54 may have the second type conductivity (as described above), and may have a junction with the first body area 511. The body region 51 may have an impurity of the second type conductivity in a lower concentration than that of the butted body 54, and hence may be intrinsic (i.e., a non-doped region) or a region of the second type conductivity. The gate stack 61 may include a gate electrode 611 and a gate dielectric 612 disposed between the body region 51 and the gate electrode 611. Each of the gate electrode 611 and the gate dielectric 612 may be in a generally T-shaped form. The spacers 62, 63, 64 separate the gate electrode 611 from the active region 52, the active region 53, and the butted body 54, respectively. The STI region 66 is disposed on the insulating layer 42 to surround the semiconductor device 5 so as to isolate the semiconductor device 5 from other device (not shown). The materials of the substrate 41, the insulating layer 42, the body region 51, the active regions 52, 53 and the butted body 54, the gate electrode 611, the gate dielectric 612, the spacers 62, 63, 64, and the STI regions 66 may be similar to those of the substrate 11, the insulating layer 12, the body region 21, the active regions 22, 23, and the butted body 24A, the gate electrode 311, the gate dielectric 312, the spacers 32, and the STI region 33, respectively. In some embodiments, a metal contact 67 is disposed in electric contact with the butted body 54.

In some embodiments, the semiconductor structure 10I may further include the above-mentioned stack(s) 20A, the stack(s) 20B, the butted body 24C, the butted bodies 24C, the butted body 24D, or the butted bodies 24D. In other words, a cross-sectional view of the semiconductor structure 10I taken along D-D line of FIG. 11 may be similar to one of FIGS. 3 to 10. In this case, the floating body effect may be further eliminated.

Figure 14:
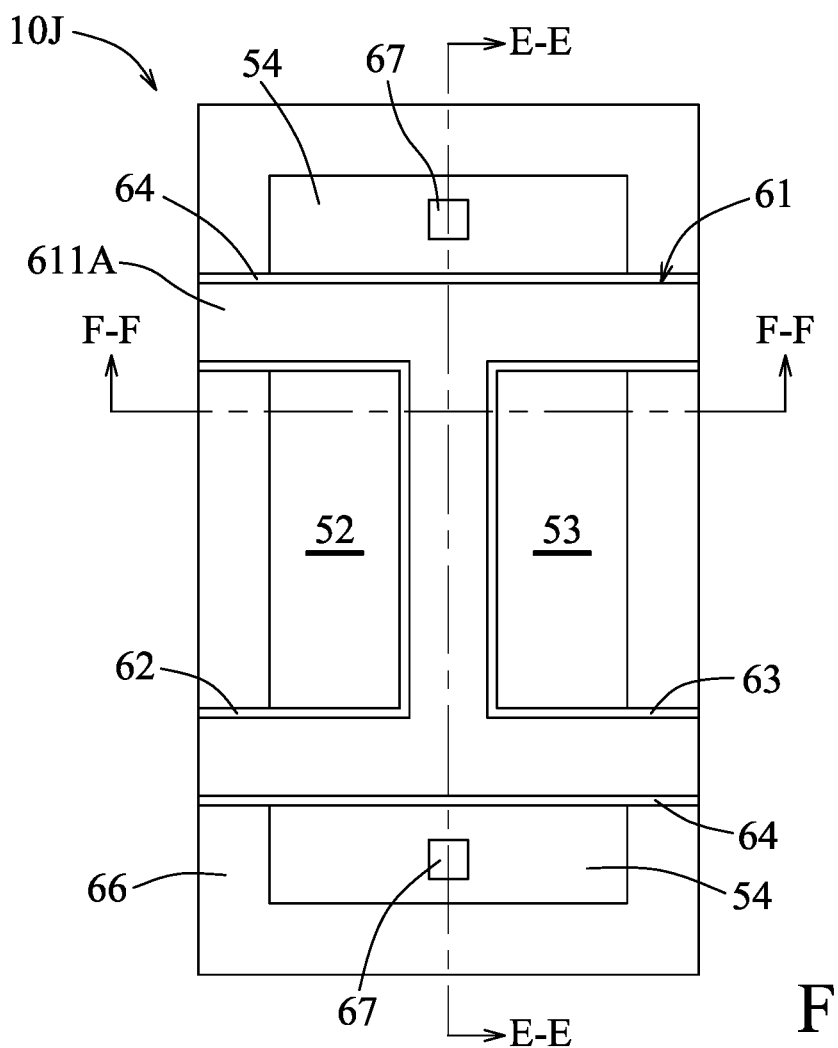
Figure 15:
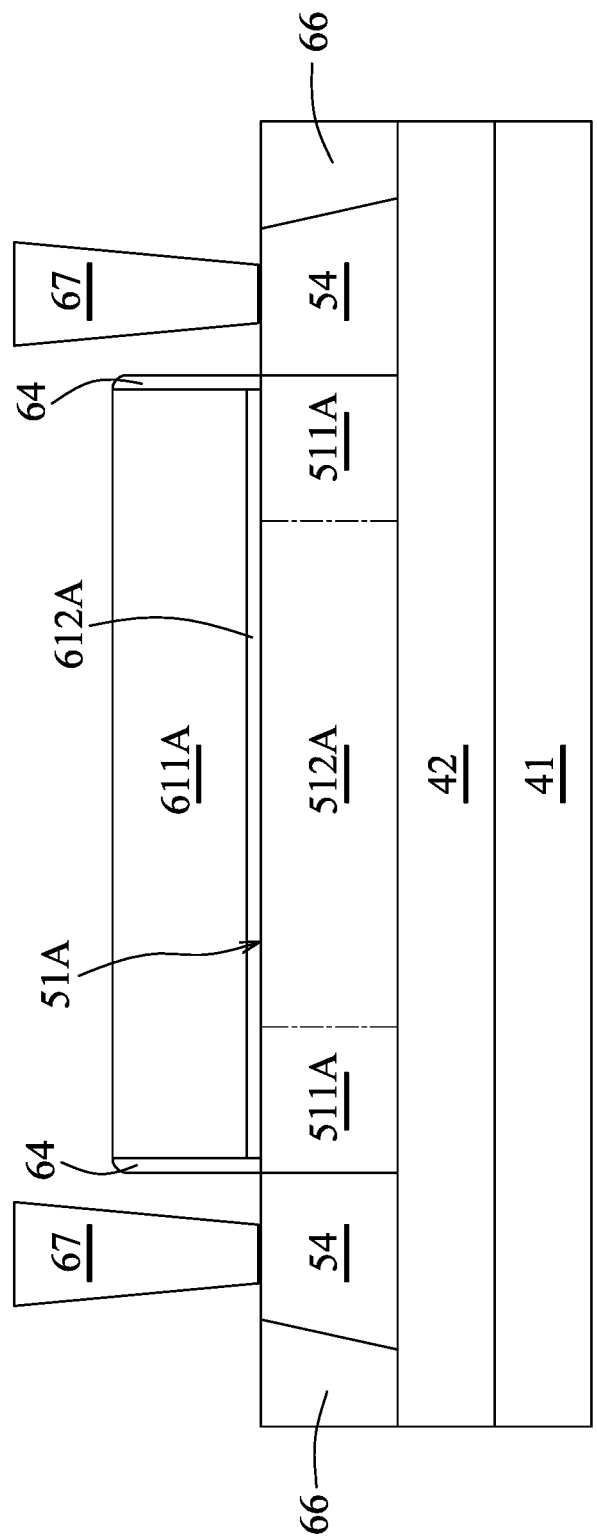
Figure 16:
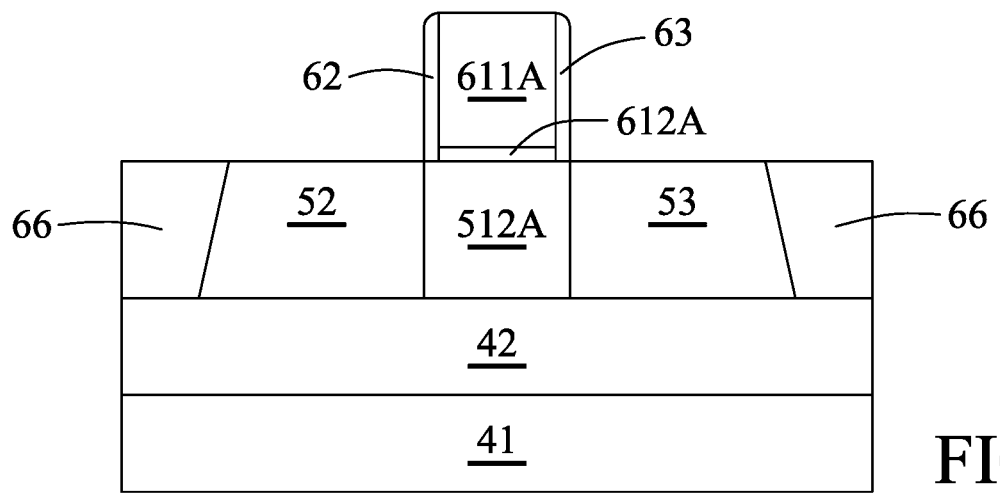

FIG. 14 illustrates a schematic top view of a semiconductor structure 10J in accordance with some embodiments. FIGS. 15 and 16 illustrate schematic cross-sectional views taken along E-E and F-F lines of FIG. 14. The semiconductor structure 10J is similar to the semiconductor structure 10I except that in the semiconductor structure 10J, a body region 51A, a gate electrode 611A, and a gate dielectric 612A, each of which is in a generally H-shaped form, are provided in replacement of the body region 51, the gate electrode 611, and the gate dielectric 612 of the semiconductor structure 10I. The materials of the body region 51A, the gate electrode 611A, and the gate dielectric 612A may be similar to those of the body region 51, the gate electrode 611, and the gate dielectric 612. The body region 51A may include two first body areas 511A and a second body area 512A. The active areas 52, 53 are located between the first body areas 511A. The second body area 512A interconnects the first body areas 511A and separates the active areas 52, 53 from each other. In addition, the semiconductor structure 10J may include two of the butted bodies 54 and two of the spacers 64. Each of the butted bodies 54 may have a junction with a respective one of the first body areas 511A. Each of the spacers 64 separates the gate electrode 611A from a respective one of the butted bodies 54. In some embodiments, two metal contacts 67 are disposed in electric contact with the butted bodies 54, respectively.

In some embodiments, the semiconductor structure 10J may further include the above-mentioned stack(s) 20A, the stack(s) 20B, the butted body 24C, the butted bodies 24C, the butted body 24D, or the butted bodies 24D. In other words, a cross-sectional view of the semiconductor structure 10J taken along F-F line of FIG. 14 may be similar to one of FIGS. 3 to 10. In this case, the floating body effect may be further eliminated.

Figure 17:
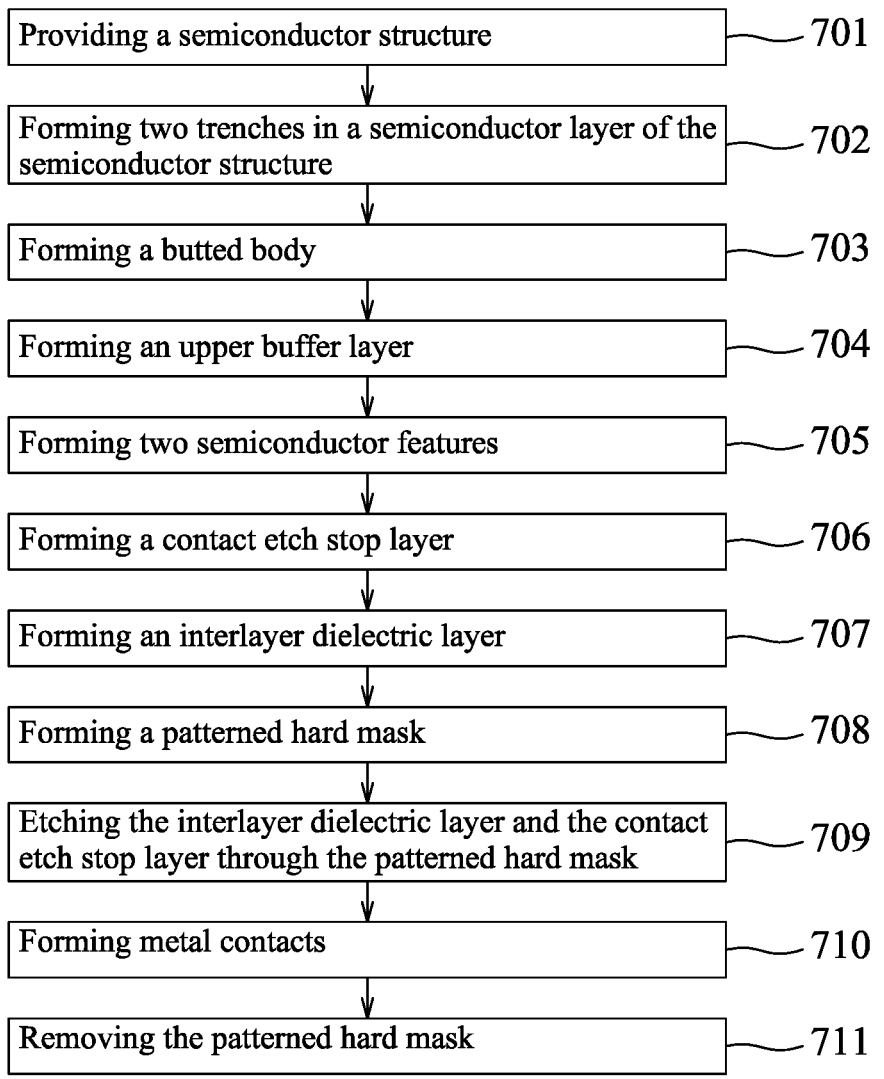
FIG. 17 is a flow diagram illustrating a method for manufacturing a semiconductor structure with a butted body in accordance with some embodiments.

FIG. 17 is a flow diagram illustrating a method 700A for manufacturing a semiconductor structure 100 in accordance with some embodiments. FIGS. 18 to 36 illustrate schematic views of the intermediate stages of the method 700A. The semiconductor structure 10A shown in FIG. 3 may be manufactured by steps 701 to 705 of the method 700A.

Figure 18:
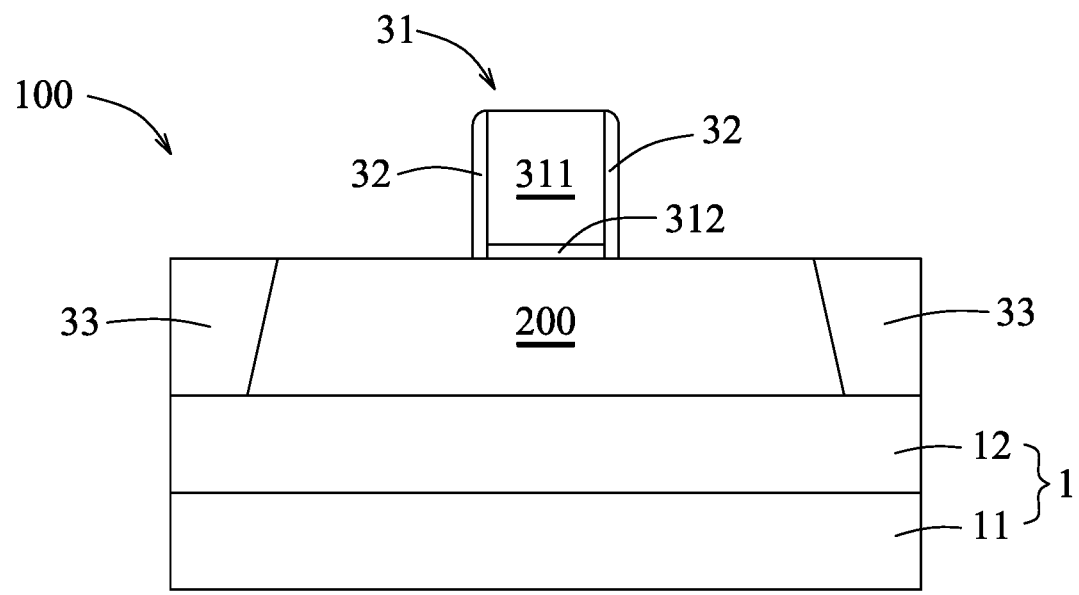
FIGS. 18 to 46 are schematic views illustrating intermediate stages of a method for manufacturing a semiconductor structure in accordance with some embodiments as depicted in FIG. 17.

Referring to FIGS. 17 and 18, the method 700A begins at step 701, where a semiconductor structure 100 is provided. The semiconductor structure 100 may include the aforesaid substrate assembly 1, a semiconductor layer 200 formed on the substrate assembly 1, the aforesaid gate stack 31 formed on the semiconductor layer 200, the aforesaid spacers 32, and the aforesaid STI region 33 formed on the insulating layer 12 of the substrate assembly 1. In the following, the steps leading up to the semiconductor structure 100 shown in FIG. 18 are briefly described. The insulating layer 12 between the semiconductor layer 200 and the substrate 11 may be formed by, for example, but not limited to, Silicon-On-Insulator (SOI) technologies, such as implanted oxygen techniques (SIMOX), bonded-and-etch-back techniques (BESOI), or other suitable techniques. The semiconductor layer 200 may be intrinsic (i.e., non-doped) or have the second type conductivity (as described above), and may have two surface regions 201a, 202a each of which is disposed between the STI region 33 and the gate stack 31. The STI region 33 may be formed by etching the semiconductor layer 200 to form a shallow trench (not shown) which surrounds an oxide definition (OD) area of the semiconductor layer 200, and filling the shallow trench with a dielectric material (which is exemplified above as a material for forming the STI region 33). The OD area, sometimes also referred to as an "oxide diffusion" area of a MOS device, defines an active area for a MOS device, i.e., an area where a source, a drain, and a channel of a MOS device are formed. The gate stack 31 may be formed by depositing a layer of gate dielectric material (not shown) and a layer of gate electrode material (not shown), followed by a lithography process and an etching process to form the gate electrode 311 and the gate dielectric 312. The spacers 32 may be formed by blanket deposition of at least one spacer-forming layer (not shown) over the gate stack 31, the semiconductor layer 200, and the STI region 33, followed by anisotropically etching to permit the spacer-forming layer to be left on two opposite sidewalls of the gate stack 31.

Figure 19:
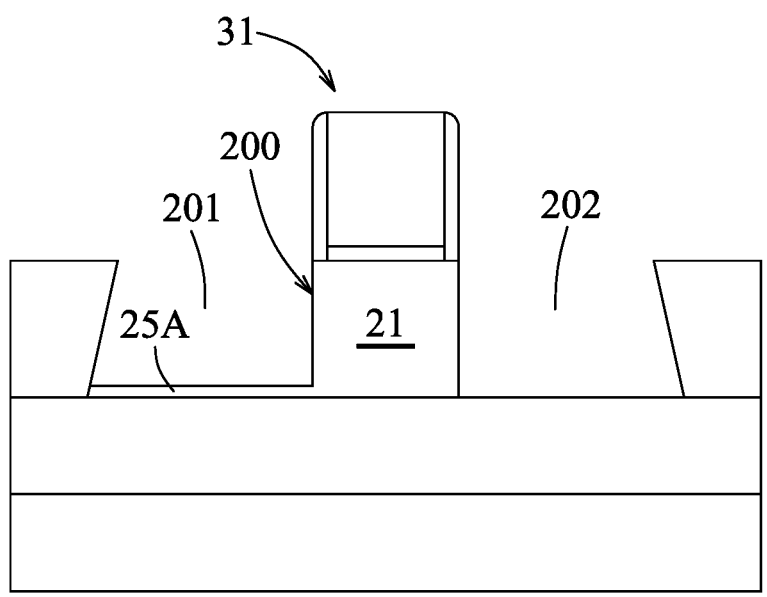

Referring to FIGS. 17 and 19, the method 700A proceeds to step 702, where two trenches 201, 202 are formed in the semiconductor layer 200 at two opposite sides of the gate stack 31. The body region 21 is thus defined in the semiconductor layer 200 between the trenches 201, 202. In some embodiments, step 702 may be implemented using a known process in the art, such as, but not limited to, a dry etching process, a wet etching process, other suitable processes, or combinations thereof.

In some embodiments, step 702 of the method 700A may include two sub-steps 702a and 702b. Sub-step 702a may include (i) forming a patterned photoresist 71 on the semiconductor structure 100 to expose the surface region 201a of the semiconductor layer 200 at one side of the gate stack 31 (see FIG. 20), (ii) etching the surface region 201a to form the trench 201 shown in FIG. 19, and (iii) removing the patterned photoresist 71. The etching of the surface region 201a in sub-step 702a is stopped short of the insulating layer 12 to leave on the insulating layer 12 a film 25A which serves as the lower buffer layer 25A (see FIG. 19). The lower buffer layer 25A may have the same conductivity type as that of the body region 21. Sub-step 702b may include (i) forming a patterned photoresist 72 on the semiconductor structure 100 to expose a surface region 202a of the semiconductor layer 200 at the other side of the gate stack 31 (see FIG. 21), (ii) etching the exposed surface region 202a to form the trench 202 shown in FIG. 19, and (iii) removing the patterned photoresist 72. The etching of the exposed surface region 202a in sub-step 702b is implemented to permit the semiconductor layer 200 beneath the exposed surface region 202a to be fully etched away to expose the insulating layer 12 (see FIG. 19). Sub-step 702b may be implemented before or after step 702a. In some embodiments, the patterned photoresist 71 or 72 may be replaced with a patterned hard mask.

In some embodiments, step 702 of the method 700A may include (i) forming a patterned photoresist 73 on the semiconductor structure 100 to expose the surface regions 201a, 202a (see FIG. 22), (ii) fully etching away the semiconductor layer 200 beneath the exposed surface regions 201a, 202a to form the trenches 201, 202 each exposing the insulating layer 12 (see FIG. 23), (iii) removing the patterned photoresist 73, (iv) forming a patterned photoresist 74 to expose the trench 201 (see FIG. 24), (v) depositing the lower buffer layer 25A on the insulating layer 12 in the trench 201 using the patterned photoresist 74 (see FIG. 25), and (vi) removing the patterned photoresist 74. The lower buffer layer 25A may have the same or different conductivity type with respect to the body region 21, and hence may be intrinsic or have the second type conductivity. The lower buffer layer 25A may be formed using a deposition process, for example, but not limited to, chemical vapor deposition (CVD), physical vapor deposition (PVD), an epitaxial growth method, sputtering, other suitable processes, or combinations thereof. The lower buffer layer 25A may be in-situ doped or non-doped during the deposition process or may be further doped after the deposition process using ion implantation or other suitable methods. In some embodiments, the patterned photoresist 73 or 74 may be replaced with a patterned hard mask.

In some embodiments, step 702 of the method 700A may include (i) forming the patterned photoresist 73 on the semiconductor structure 100 to expose the surface regions 201a, 202a (see FIG. 22), (ii) etching the exposed surface regions 201a, 202a to form the trenches 201, 202 in which two films 25A are respectively left on the insulating layer 12 (see FIG. 26), (iii) removing the patterned photoresist 73, (iv) forming a patterned photoresist 75 on the semiconductor structure 100 to expose the trench 202 (see FIG. 27), (iv) etching the film 25A in the trench 202 to expose the insulating layer 12, and (v) removing the patterned photoresist 75. In some embodiments, the patterned photoresist 73 or 75 may be replaced with a patterned hard mask.

In some embodiments, other suitable methods may also be applied for forming the semiconductor structure 100 shown in FIG. 19.

Figure 28:
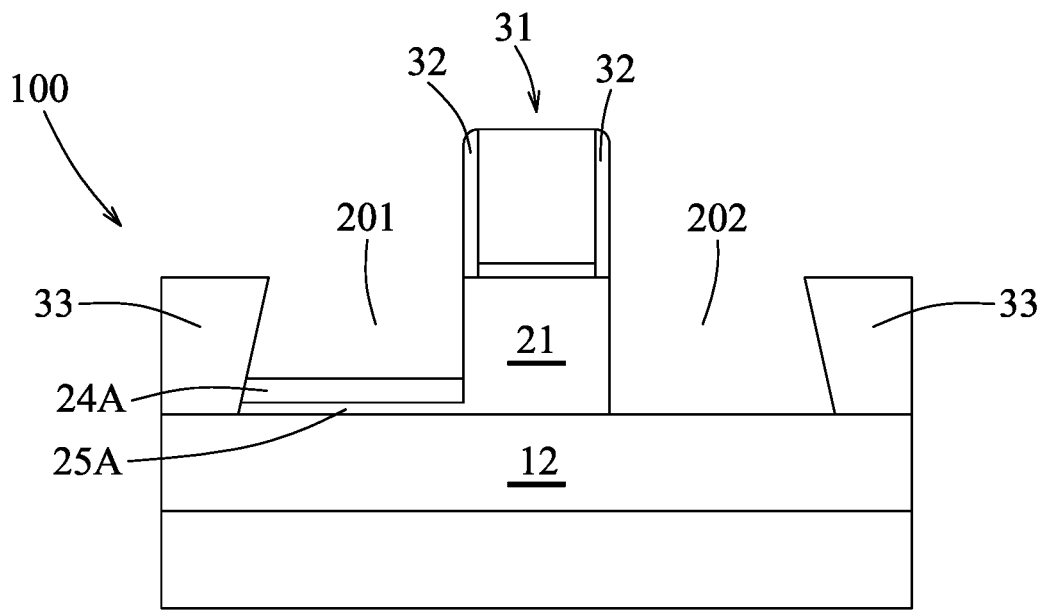

Referring to FIGS. 17 and 28, the method 700A proceeds to step 703, where the butted body 24A is formed in the trench 201. The butted body 24A may have the second type conductivity and may include the impurity of the second type conductivity in a concentration higher than that of the body region 21 (as described above). The provision of the lower buffer layer 25A may facilitate the formation of the butted body 24A, and the butted body 24A may be selectively formed over the lower buffer layer 25A, not on the insulating layer 12, the gate stack 31, the spacers 32, and the STI region 33 using a deposition process, for example, but not limited to, a selective epitaxial growth (SEG) method, or other suitable methods. The butted body 24A may be in-situ doped during the deposition process or may be further doped after the deposition process using ion implantation or other suitable methods.

Figure 29:
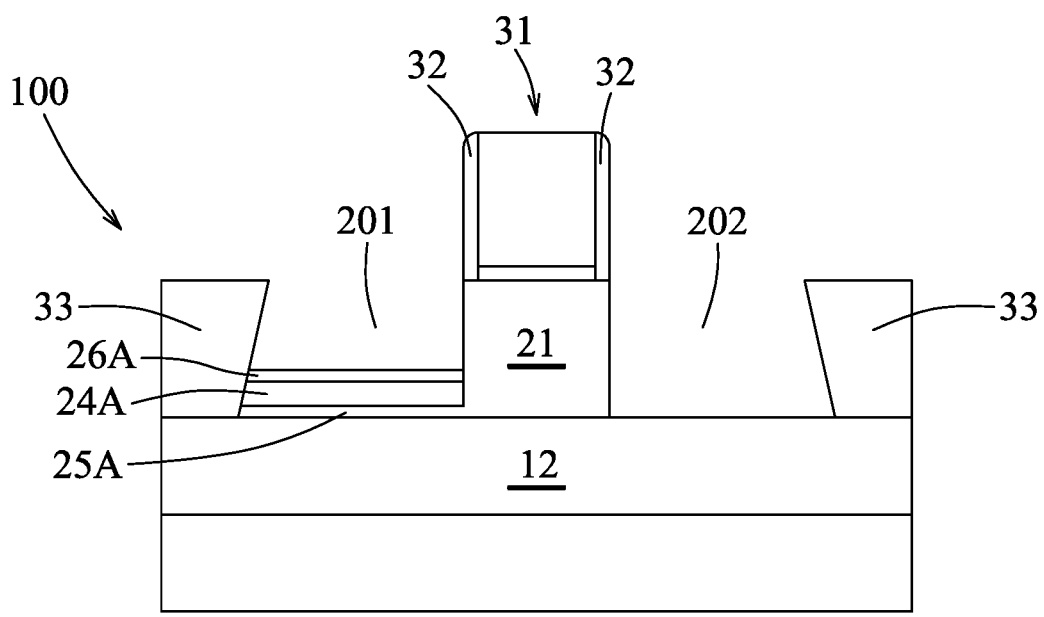

Referring to FIGS. 17 and 29, the method 700A proceeds to step 704, where the upper buffer layer 26A is formed in the trench 201. In some embodiments, the upper buffer layer 26A may be formed by, but not limited to, surface modification or treatment of an upper surface of the butted body 24A. The surface modification or treatment may be, for example, but not limited to a plasma treatment, a species bombardment, a thermal treatment, or other suitable treatments. In other embodiments, the upper buffer layer 26A may be selectively formed on the butted body 24A, not on the insulating layer 12, the gate stack 31, the spacers 32, and the STI region 33 formed using a deposition process, for example, but not limited to, a selective epitaxial growth (SEG) method or other suitable methods. The upper buffer layer 26A may be in-situ doped or non-doped during the deposition process or may be further doped after the deposition process using ion implantation or other suitable methods.

Figure 30:
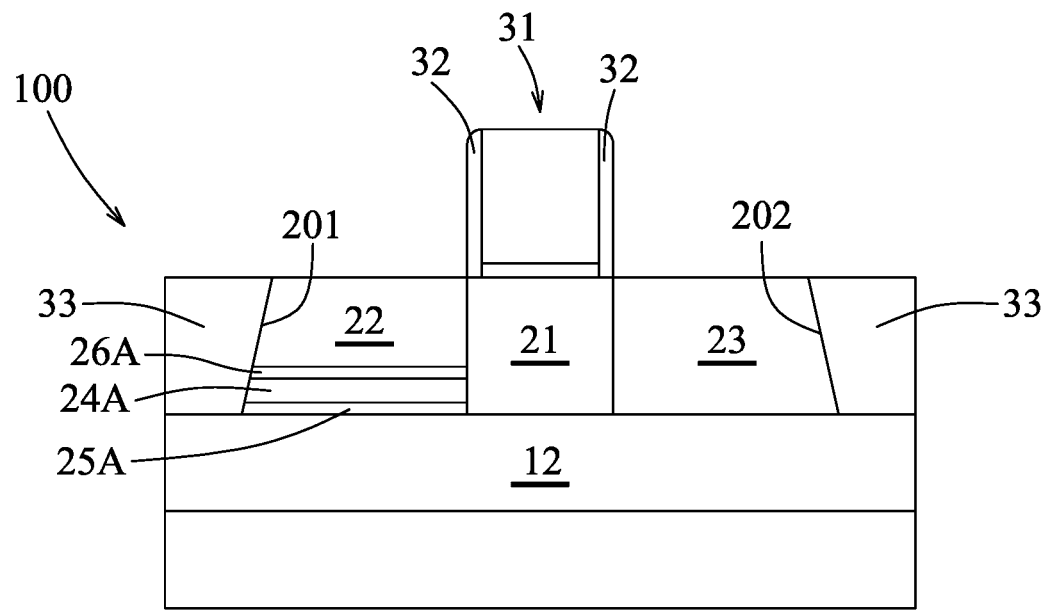

Referring to FIGS. 17 and 30, the method 700A proceeds to step 705, where two semiconductor features, which correspond to the active regions 22, 23 of the semiconductor structure 10A shown in FIG. 3, are respectively formed in the trenches 201, 202. The provision of the upper buffer layer 26A may facilitate the formation of the semiconductor feature 22. The semiconductor features 22, 23 may be selectively formed to fill in the trenches 201, 202, not formed on the gate stack 31, the spacers 32, and the STI region 33, using a deposition process, for example, but not limited to, a selective epitaxial growth (SEG) method or other suitable methods. The semiconductor features 22, 23 may have the first type conductivity (as described above). The semiconductor features 22, 23 may be in-situ doped during the deposition process or may be further doped after the deposition process using ion implantation or other suitable methods. The semiconductor structure 100 obtained after step 705 of the method 700A may have the same structure as the semiconductor structure 10A shown in FIG. 3. In alternative embodiments, other suitable methods may also be applied for forming the semiconductor structure 10A shown in FIG. 3.

Figure 31:
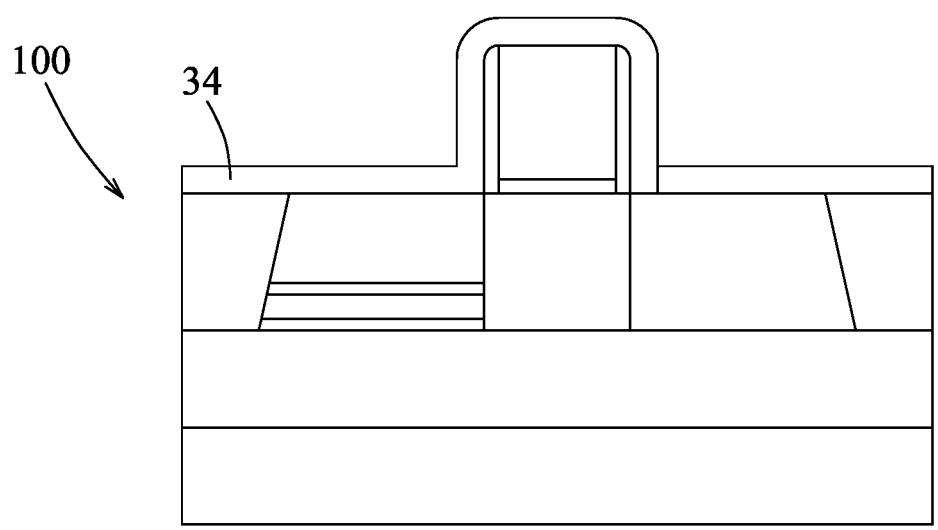

Referring to FIGS. 17 and 31, the method 700A proceeds to step 706, where a contact etch stop layer (CESL) 34 is formed over the semiconductor structure 100. The CESL 34 may include, but is not limited to, SiN, SiON, silicon oxy-nitride, a combination of oxide and SiN, SiC, or other suitable materials, and may be formed using a blanket deposition process, such as, but not limited to, chemical vapor deposition (CVD), high density plasma CVD (HDPCVD), sub-atmospheric CVD (SACVD), molecular layer deposition (MLD), physical vapor deposition (PVD), sputtering, or other suitable methods.

Figure 32:
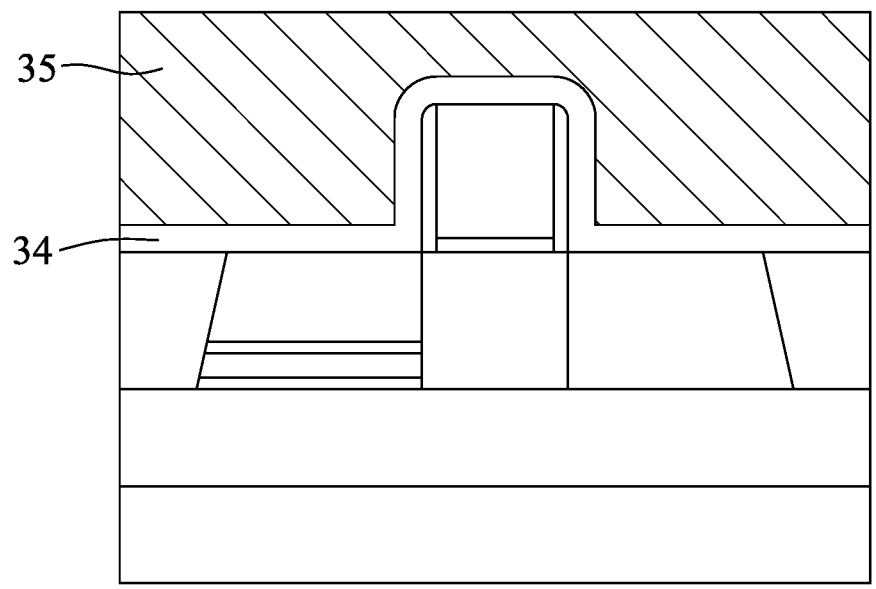

Referring to FIGS. 17 and 32, the method 700A proceeds to step 707, where an interlayer dielectric (ILD) layer 35 is formed over the CESL 34. The ILD layer 35 may include a dielectric material such as, but is not limited to, silicon oxide, silicon nitride, silicon oxynitride, other suitable materials, or the combinations thereof. The ILD layer 35 may be formed by blanket depositing a layer of the dielectric material using, for example, but not limited to, CVD, HDPCVD, SACVD, MLD, PVD, sputtering, or other suitable methods, and followed by a chemical mechanical polishing (CMP) process or other suitable methods to planarize the layer of dielectric material.

Figure 33:
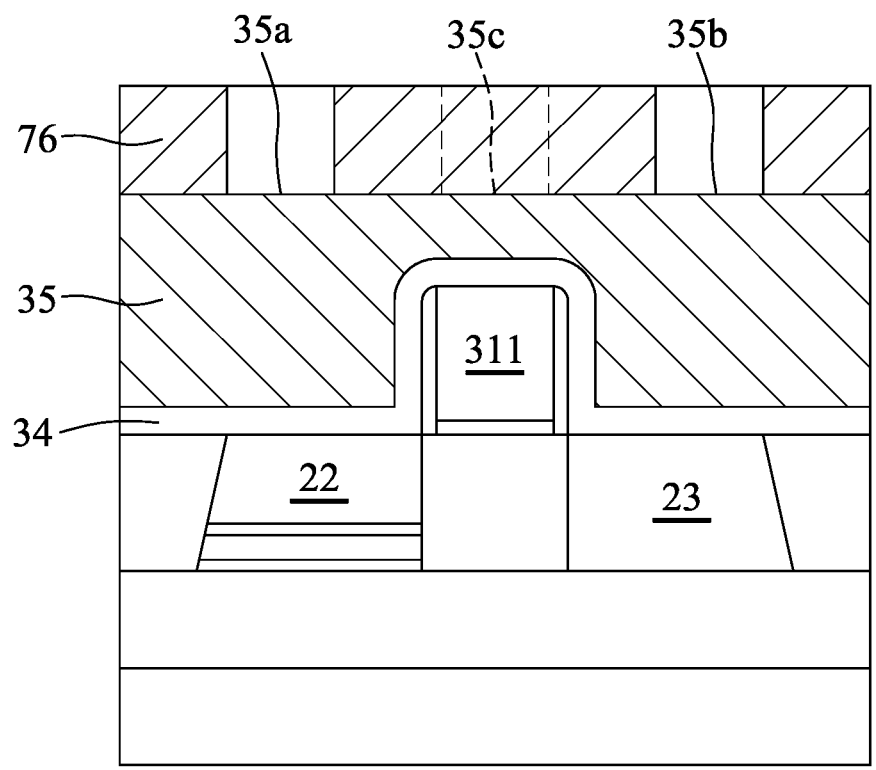

Referring to FIGS. 17 and 33, the method 700A proceeds to step 708, where a patterned hard mask 76 is formed on the ILD layer 35 to expose three regions 35a, 35b, 35c of the ILD layer 35. The exposed regions 35a, 35b, 35c are in positions corresponding to the semiconductor features 22, 23 and the gate electrode 311, respectively. In some embodiments, the patterned hard mask 76 may be replaced with a patterned photoresist.

Figure 34:
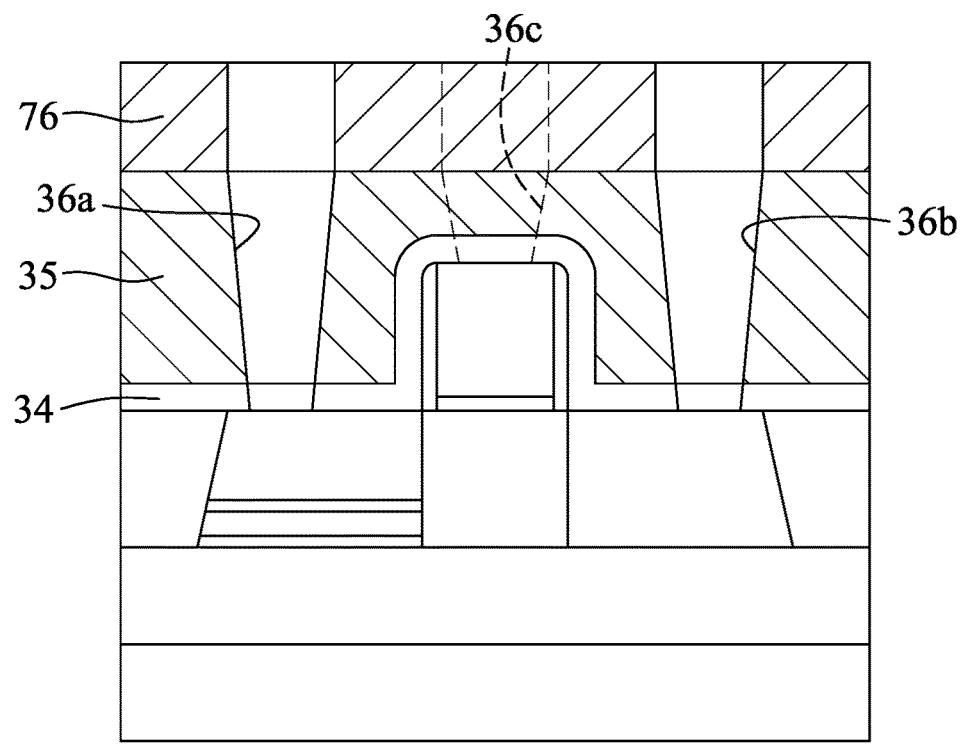

Referring to FIGS. 17 and 34, the method 700A proceeds to step 709, where the ILD layer 35 and the CESL 34 are etched through the patterned hard mask 76 to form three recesses 36a, 36b, 36c. Step 709 may be implemented using a known process in the art, such as, but not limited to, a dry etching process, a wet etching process, other suitable processes, or combinations thereof.

Figure 35:
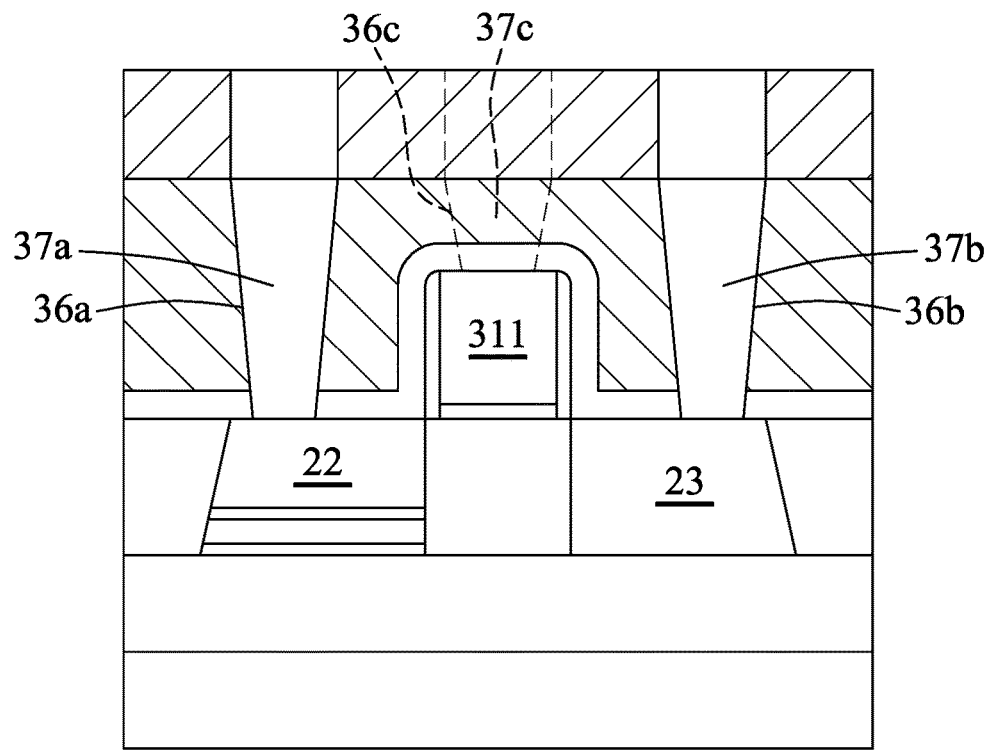

Referring to FIGS. 17 and 35, the method 700A proceeds to step 710, where three metal contacts 37a, 37b, 37c are formed respectively in the three recesses 36a, 36b, 36c. The metal contacts 37a, 37b, 37c may include an electrically conductive material such as, but not limited to, copper, gold, silver, other suitable materials, and may be formed by, for example, but not limited to, CVD or other suitable methods.

Figure 36:
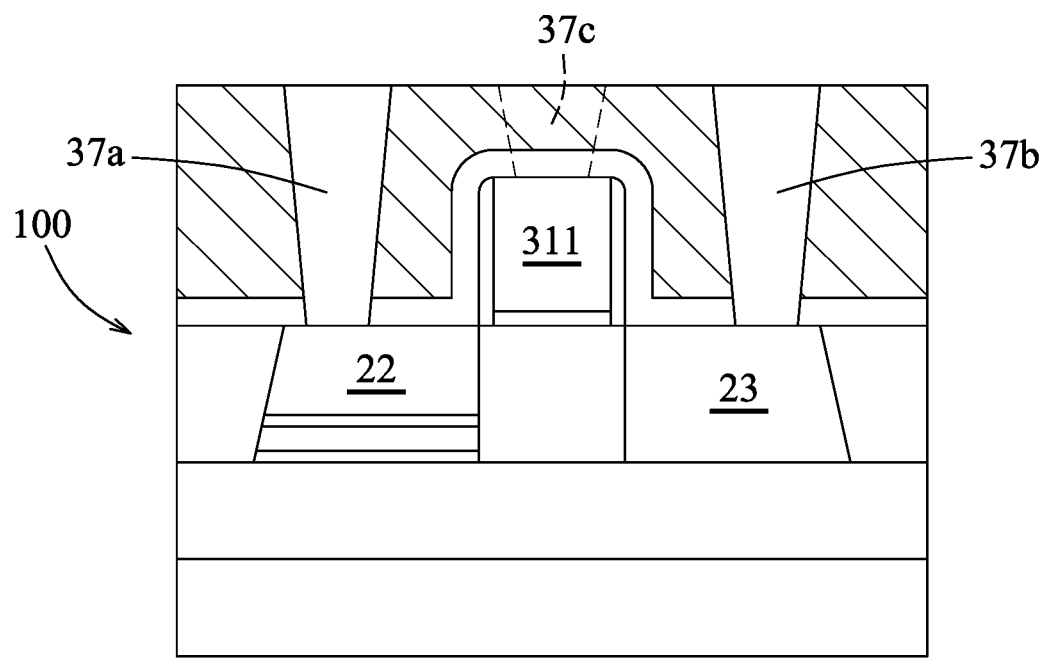

Referring to FIGS. 17 and 36, the method 700A proceeds to step 711 where the patterned hard mask 76 shown in FIG. 35 is removed. In some embodiments, step 711 may be skipped and the patterned hard mask 76 may be kept in the semiconductor structure 100. In the subsequent processes, each of the semiconductor features 22, 23 and the gate electrode 311 may be electrically connected to an outer metal wiring (not shown) through a respective one of the metal contacts 37a, 37b, 37c.

Figure 37:
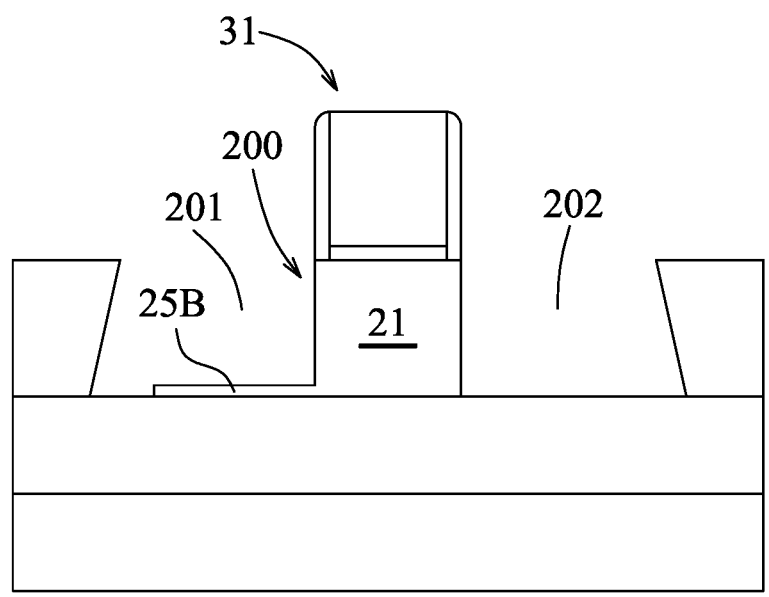

The semiconductor structure 10B at an intermediate stage shown in FIG. 4 may be obtained by a method 700B in accordance with some embodiments. The method 700B is similar to the method 700A except for step 702. Referring to FIGS. 17 and 37, in step 702 of the method 700B, the trenches 201, 202 are formed in the semiconductor layer 200 at two opposite sides of the gate stack 31, and the lower buffer layer 25B is formed in the trench 201.

Figure 38:
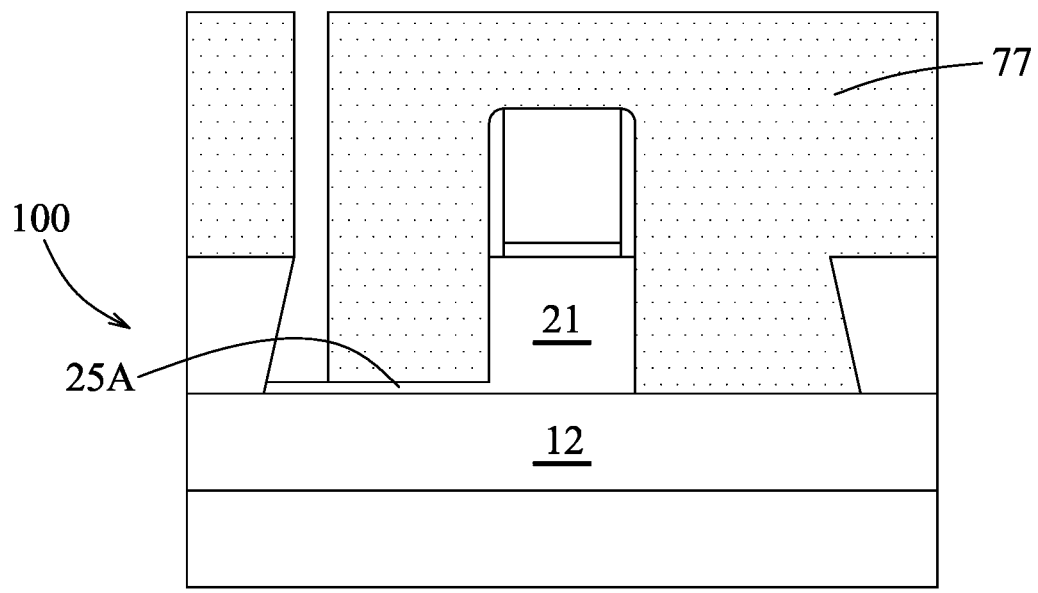

In some embodiments, step 702 of the method 700B may include (i) forming the semiconductor structure 100 of FIG. 19 (as described above, the semiconductor structure 100 has the lower buffer layer 25A), (ii) forming a patterned photoresist 77 on the semiconductor structure 100 to expose a portion of the lower buffer layer 25A (see FIG. 38; the exposed portion of the lower buffer layer 25A may be distal from the body region 21), (iii) etching the exposed portion of the lower buffer layer 25A to obtain the lower buffer layer 25B shown in FIG. 37, and (iv) removing the patterned photoresist 77. In some embodiments, the patterned photoresist 77 may be replaced with a patterned hard mask.

Figure 23:
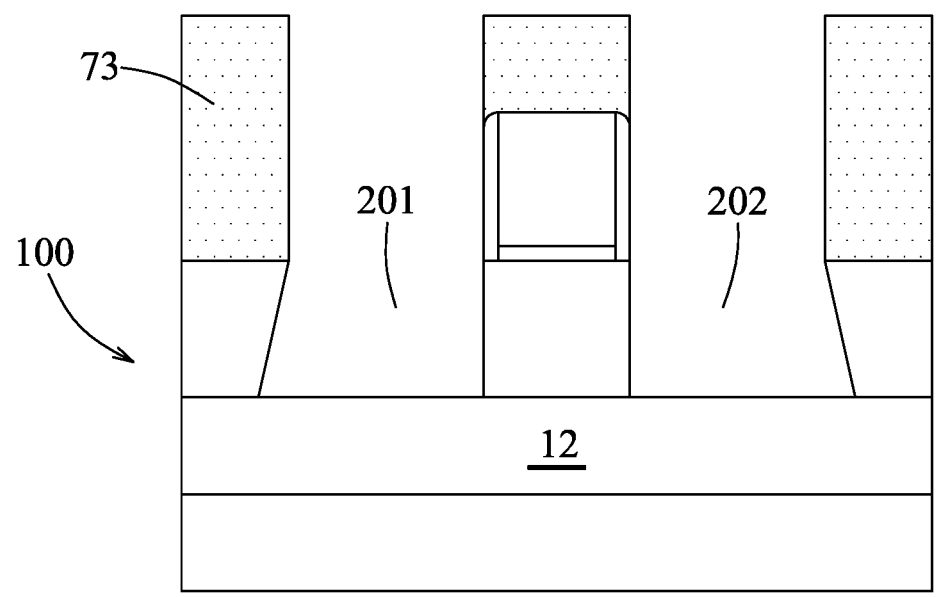
Figure 24:
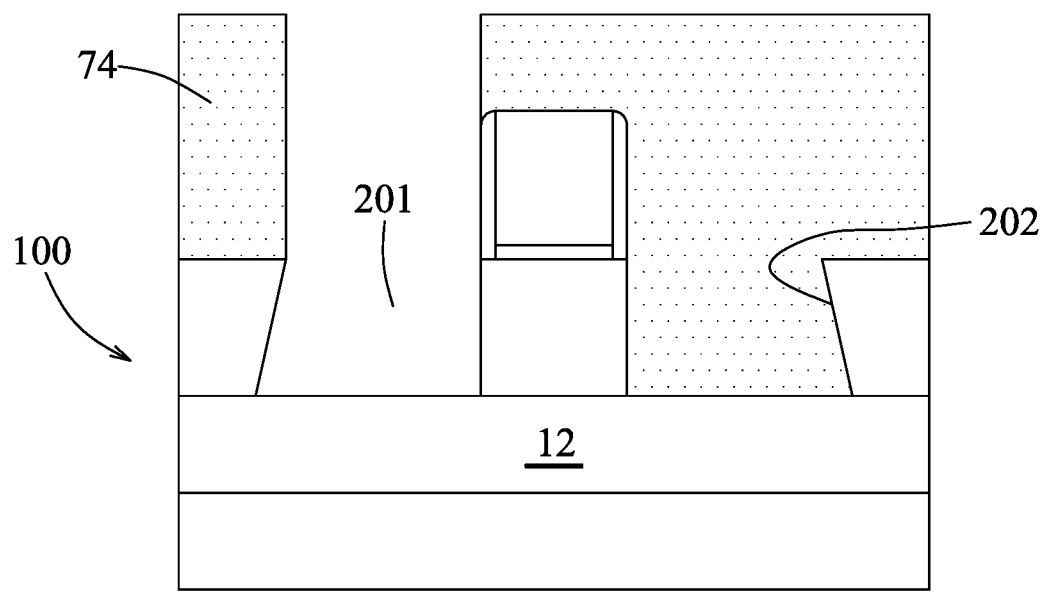
Figure 25:
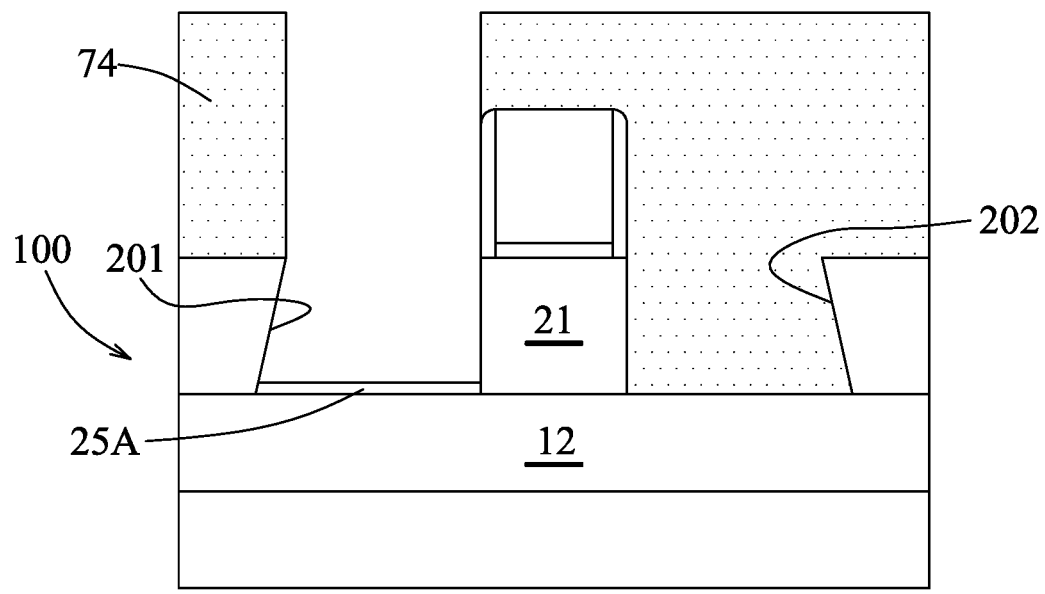
Figure 39:
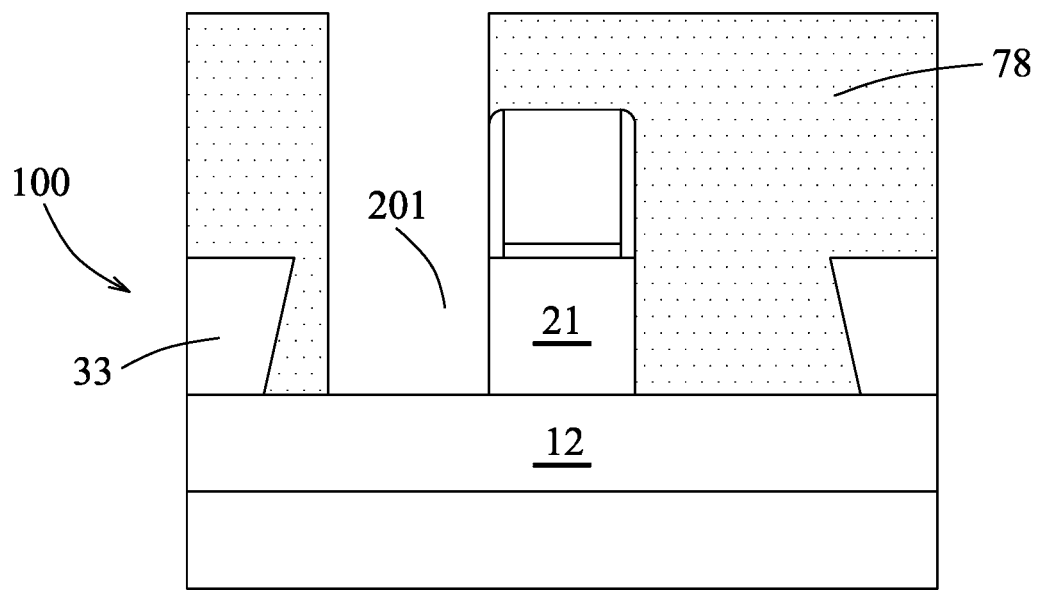

In some embodiments, step 702 of the method 700B may include (i) etching to form the semiconductor structure 100 shown in FIG. 23 using the patterned photoresist 73 (as described above), (ii) removing the patterned photoresist 73, (iii) forming a patterned photoresist 78 on the semiconductor structure 100 to partially expose a bottom of the trench 201 (see FIG. 39), (iv) depositing the lower buffer layer 25B as shown in FIG. 4 or FIG. 37 on the insulating layer 12 in the trench 201, and (v) removing the patterned photoresist 78. The lower buffer layer 25B may have the same or different conductivity type with respect to the body region 21, and may be intrinsic or have the second type conductivity (as described above). The lower buffer layer 25B in step 702 of the method 700B may be deposited using the aforesaid method for depositing the lower buffer layer 25A in step 702 of the method 700A. In some embodiments, the patterned photoresist 73 or 78 may be replaced with a patterned hard mask.

In some embodiments, other suitable methods may also be applied for forming the semiconductor structure 100 shown in FIG. 37.

In addition, referring to FIGS. 4 and 17, the butted body 24B may be formed on the lower buffer layer 25B in step 703 of the method 700B; the upper buffer layer 26B may be formed on the butted body 24B in step 704 of the method 700B; and the semiconductor features 22, 23 may be respectively formed in the trenches 201, 202 in step 705 of the method 700B. The semiconductor feature 22 on the upper buffer layer 26B may be formed to be in contact with the insulating layer 12. After step 705 of the method 700B, the semiconductor structure 10B shown in FIG. 4 may be obtained and may be further processed in a manner similar to steps 706 to 711 of the method 700A. In alternative embodiments, other suitable methods may also be applied for forming the semiconductor structure 10B shown in FIG. 4.

Figure 40:
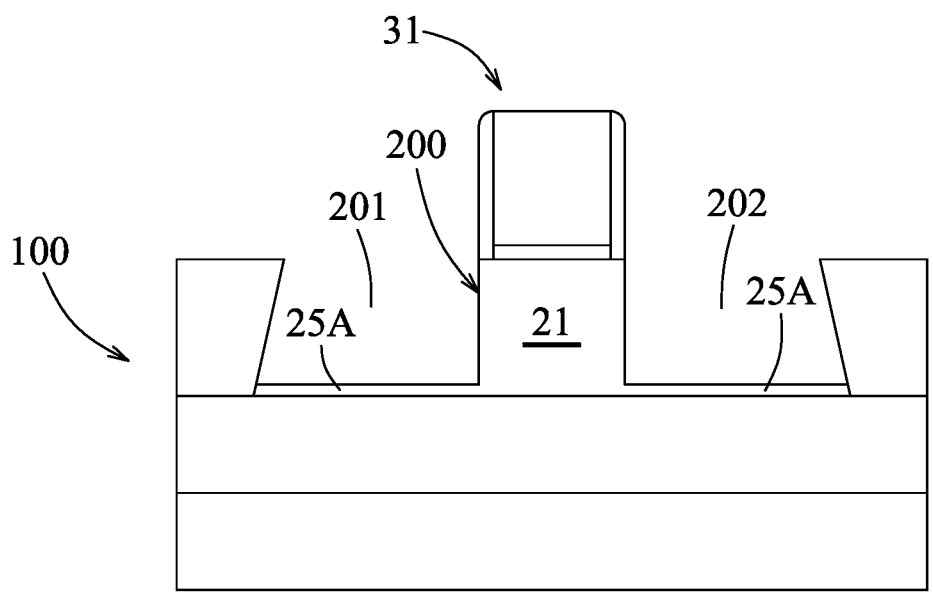

The semiconductor structure 10C at an intermediate stage shown in FIG. 5 may be obtained by a method 700C in accordance with some embodiments. The method 700C is similar to the method 700A except for step 702. Referring to FIGS. 17 and 40, in step 702 of the method 700C, the trenches 201, 202 are formed in the semiconductor layer 200 at two opposite sides of the gate stack 31, and the two lower buffer layers 25A are formed respectively in the trenches 201, 202.

Figure 26:
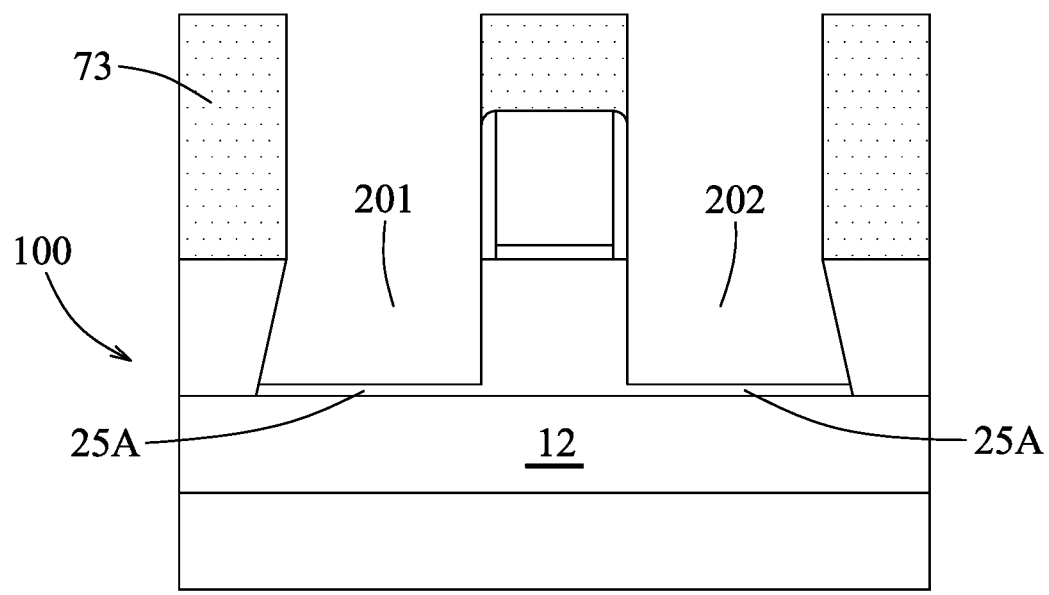
Figure 27:
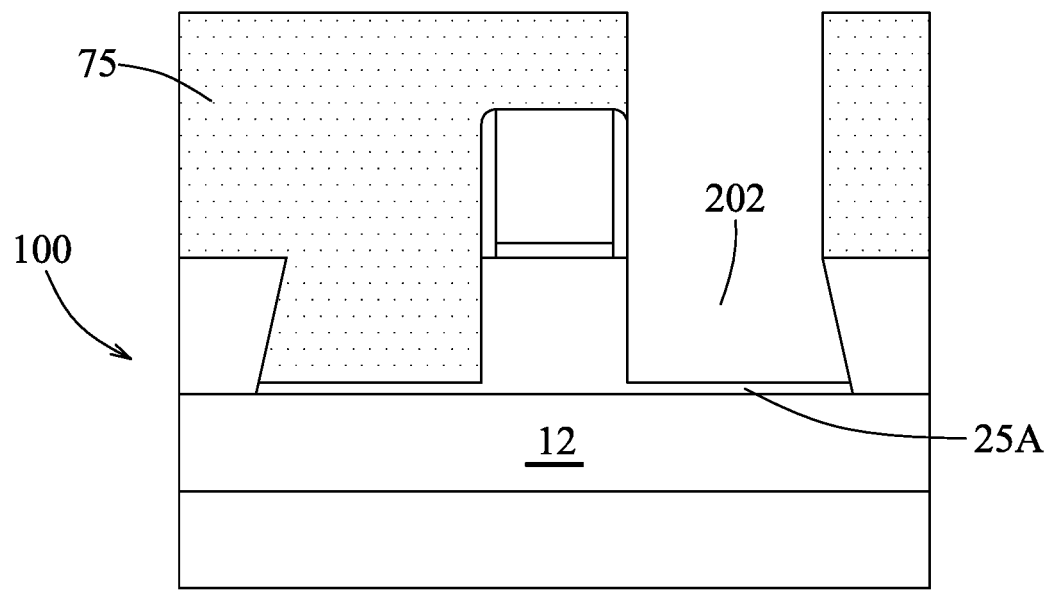

In some embodiments, step 702 of the method 700C may include (i) forming the patterned photoresist 73 on the semiconductor structure 100 to expose the surface regions 201a, 202a (see FIG. 22), and (ii) etching the exposed surface regions 201a, 202a to form the trenches 201, 202 in which two films 25A are respectively left on the insulating layer 12 (see FIG. 26). The two films 25A left on the insulating layer 12 in the trenches 201, 202 respectively serve as the two lower buffer layers 25A of FIG. 5.

In some embodiments, step 702 of the method 700C may include (i) etching to form the semiconductor structure 100 of FIG. 23 using the patterned photoresist 73 (described above), (ii) depositing the two lower buffer layers 25A shown in FIG. 5 or FIG. 40 respectively in the trenches 201, 202 using the patterned photoresist 73 shown in FIG. 23, and (iii) removing the patterned photoresist 73. The lower buffer layers 25A may have the same as or different conductivity type with respect to the body region 21, and may be intrinsic or have the second type conductivity. The lower buffer layers 25A in step 702 of the method 700C may be deposited using the aforesaid method for forming the lower buffer layer 25A in step 702 of the method 700A.

In some embodiments, other suitable methods may also be applied for forming the semiconductor structure 100 shown in FIG. 40.

Figure 41:
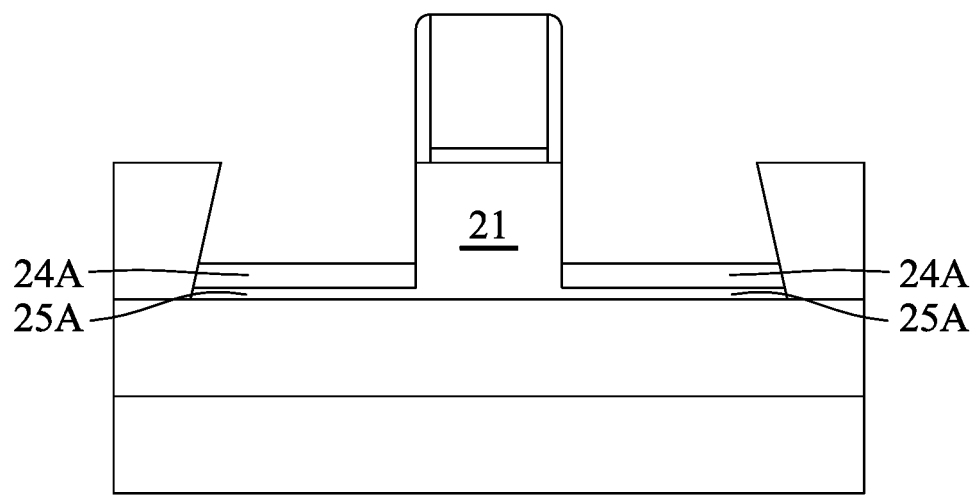
Figure 42:
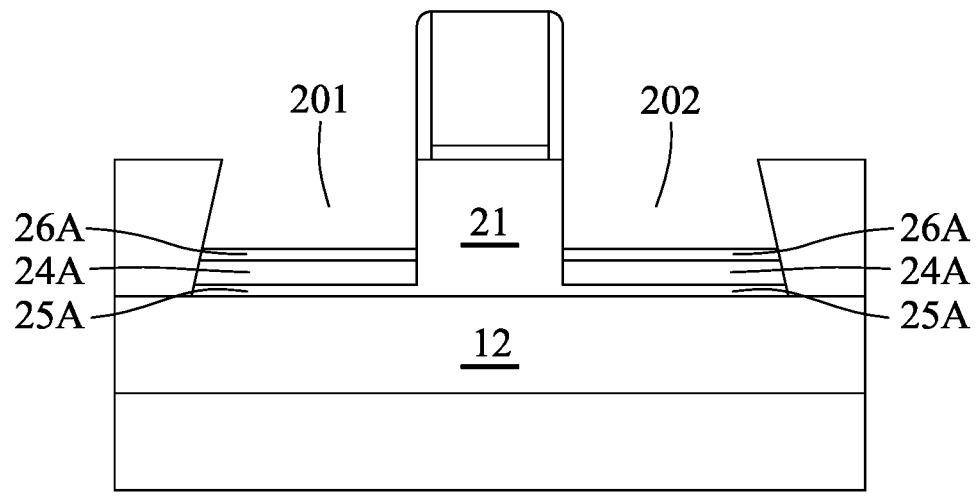

In addition, referring to FIG. 17, two of the butted bodies 24A may be respectively formed on the lower buffer layers 25A in step 703 of the method 700C (see FIG. 41); two of the upper buffer layers 26A may be respectively formed on the butted bodies 24A in step 704 of the method 700C (see FIG. 42); and the semiconductor features 22, 23 may be respectively formed on the upper buffer layers 26A in step 705 of the method 700C (see FIG. 5). After step 705 of the method 700C, the semiconductor structure 10C shown in FIG. 5 may be obtained and may be further processed in a manner similar to steps 706 to 711 of the method 700A. In alternative embodiments, other suitable methods may also be applied for forming the semiconductor structure 10C shown in FIG. 5.

Figure 43:
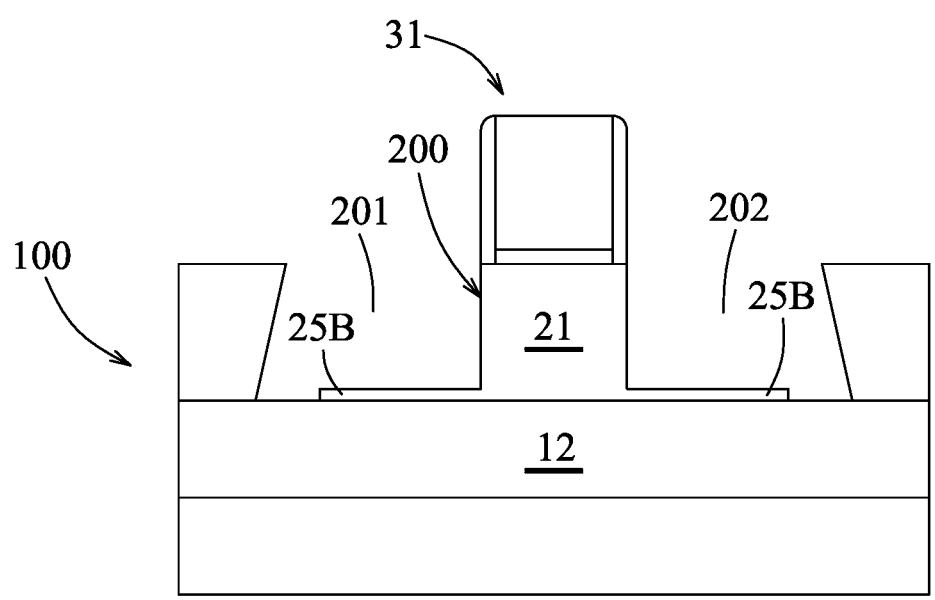

The semiconductor structure 10D at an intermediate stage shown in FIG. 6 may be obtained by a method 700D in accordance with some embodiments. The method 700D is similar to the method 700A except for step 702. Referring to FIGS. 17 and 43, in step 702 of the method 700D, the trenches 201, 202 are formed in the semiconductor layer 200 at two opposite sides of the gate stack 31, and the two lower buffer layers 25B are formed respectively in the trenches 201, 202.

Figure 44:
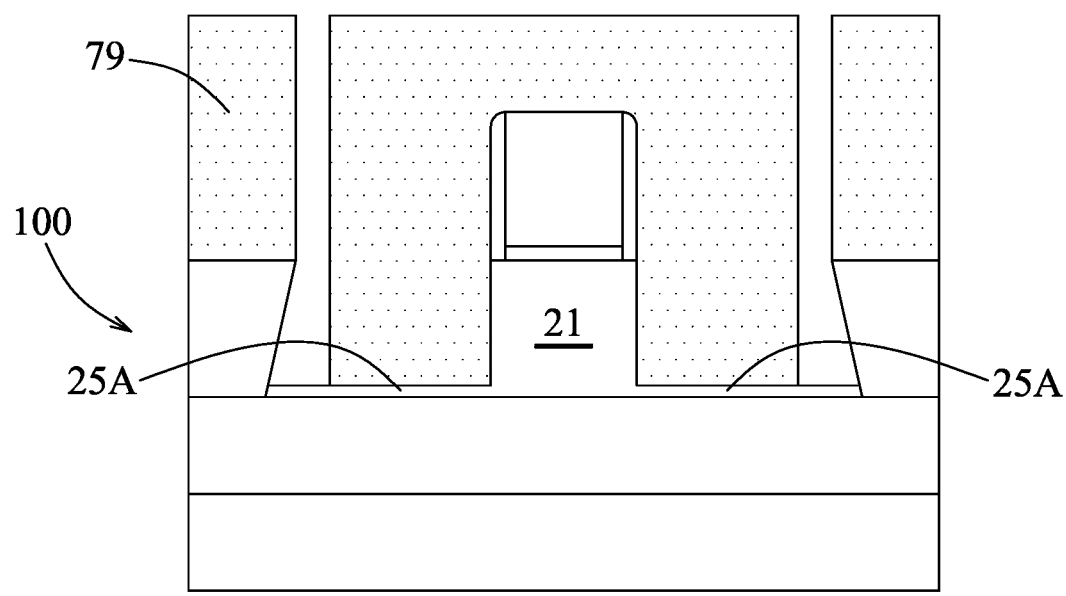

In some embodiments, step 702 of the method 700D may include (i) etching to form the semiconductor structure 100 of FIG. 26 using the patterned photoresist 73 (as described above, the semiconductor structure 100 has the two lower buffer layers 25A), (ii) removing the patterned photoresist 73, (iii) forming a patterned photoresist 79 on the semiconductor structure 100 to expose a portion of each of the lower buffer layers 25A (as shown in FIG. 44, the exposed portions of the lower buffer layers 25A are distal from the body region 21), (vi) etching the exposed portions of the lower buffer layers 25A to obtain the two lower buffer layers 25B shown in FIG. 6, and (v) removing the patterned photoresist 79. In some embodiments, the patterned photoresist 73 or 79 may be replaced with a patterned hard mask.

In some embodiments, step 702 of the method 700D may include (i) etching to form the semiconductor structure 100 of FIG. 23 using the patterned photoresist 73 (as described above), (ii) removing the patterned photoresist 73, (iii) forming a patterned photoresist 80 on the semiconductor structure 100 to partially expose a bottom of each of the trenches 201, 202 (see FIG. 45; the exposed bottom portions of the trenches 201, 202 are distal from the STI region 33), (iv) depositing the two lower buffer layers 25B shown in FIG. 6 on the insulating layer 12 respectively in the trenches 201, 202 using the patterned photoresist 80, and (v) removing the patterned photoresist 80. The lower buffer layers 25B may be deposited using the aforesaid method for depositing the lower buffer layer 25A in step 702 of the method 700A. In some embodiments, the patterned photoresist 73 or 80 may be replaced with a patterned hard mask.

In some embodiments, other suitable methods may also be applied for forming the semiconductor structure 100 shown in FIG. 43.

In addition, referring to FIGS. 6 and 17, two of the butted bodies 24B may be respectively formed on the lower buffer layers 25B in step 703 of the method 700D; two of the upper buffer layers 26B may be respectively formed on the butted bodies 24B; and the semiconductor features 22, 23 may be respectively formed on the upper buffer layers 26B to be in contact with the insulating layer 12 in step 705 of the method 700D. After step 705 of the method 700D, the semiconductor structure 10D shown in FIG. 6 may be obtained and may be further processed in a manner similar to steps 706 to 711 of the method 700A. In alternative embodiments, other suitable methods may also be applied for forming the semiconductor structure 10D shown in FIG. 6.

The semiconductor structure 10E at an intermediate stage shown in FIG. 7 may be obtained by a method 700E in accordance with some embodiments. The method 700E may be similar to the method 700A except for steps 702-705.

Figure 46:
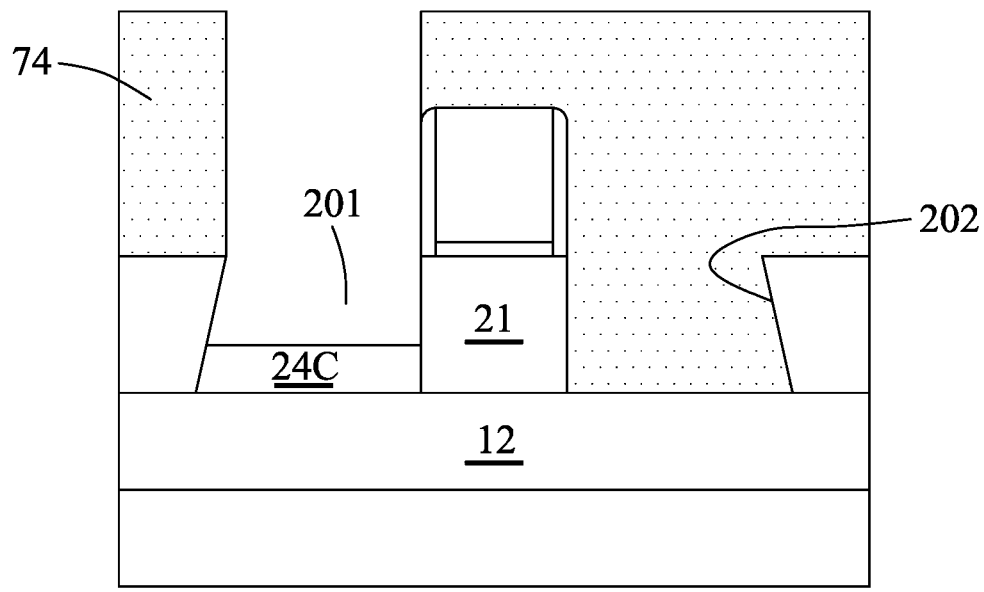

In some embodiments, referring to FIG. 17, in the method 700E, step 702 may include (i) etching to form the semiconductor structure 100 shown in FIG. 23 using the patterned photoresist 73 (as described above), and (ii) removing the patterned photoresist 73; step 703 may include (i) forming the patterned photoresist 74 on the semiconductor structure 100 to expose the trench 201 (see FIG. 24), (ii) depositing the butted body 24C on the insulating layer 12 in the trench 201 using the patterned photoresist 74 (see FIG. 46), and (iii) removing the patterned photoresist 74; step 704 may be skipped; and step 705 may be implemented to form respectively in the trenches 201, 202 two semiconductor features which correspond to the active regions 22, 23 of the semiconductor structure 10E shown in FIG. 7. The butted body 24C in step 703 of the method 700E may be deposited using for example, but not limited to, CVD, PVD, an epitaxial growth method, sputtering, or other suitable methods. The semiconductor features 22, 23 in step 705 of the method 700E may be formed using the aforesaid method for forming the semiconductor features 22, 23 in step 705 of the method 700A.

Figure 47:
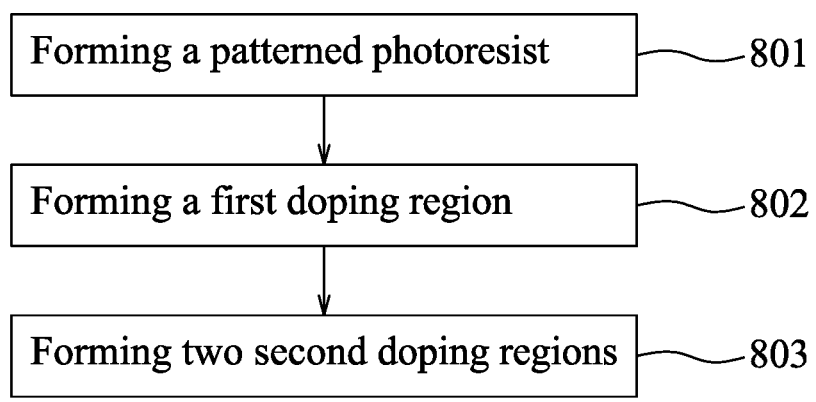
FIG. 47 is a flow diagram illustrating a method for manufacturing a semiconductor structure in accordance with some embodiments.

In some embodiments, steps 801-803 shown in FIG. 47 may be used to replace steps 702-705 of the method 700E.

Figure 20:
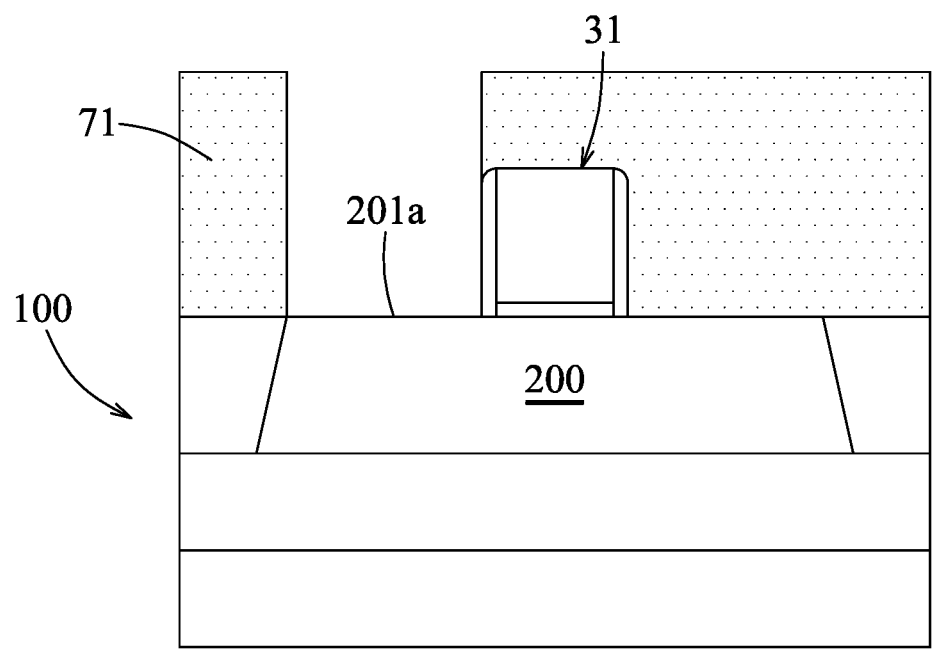
Figure 21:
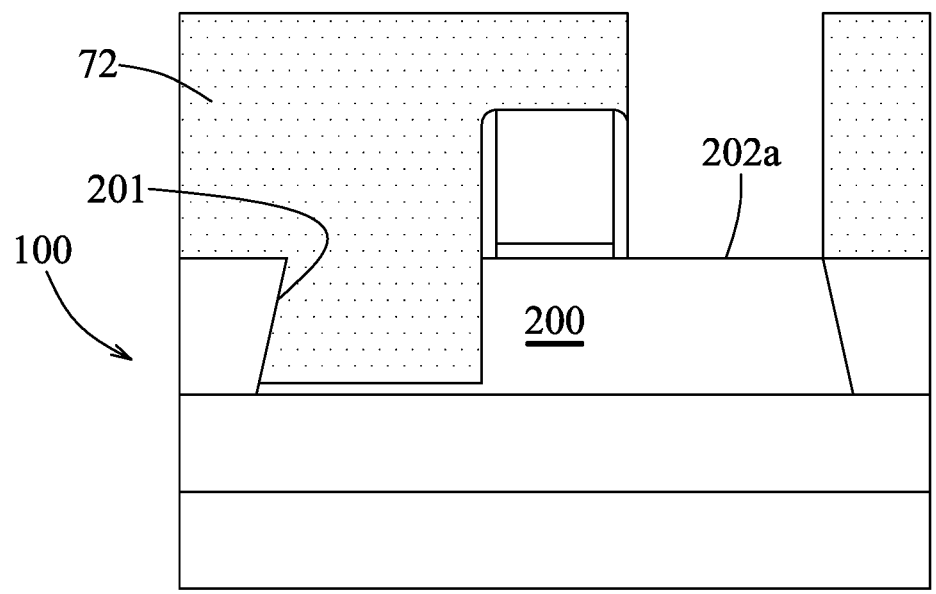

Referring to FIGS. 20 and 47, the method 700E proceeds to step 801 where the patterned photoresist 71 is formed over the semiconductor structure 100 to expose the surface region 201a of the semiconductor layer 200. The patterned photoresist 71 may be replaced by a patterned hard mask.

Figure 48:
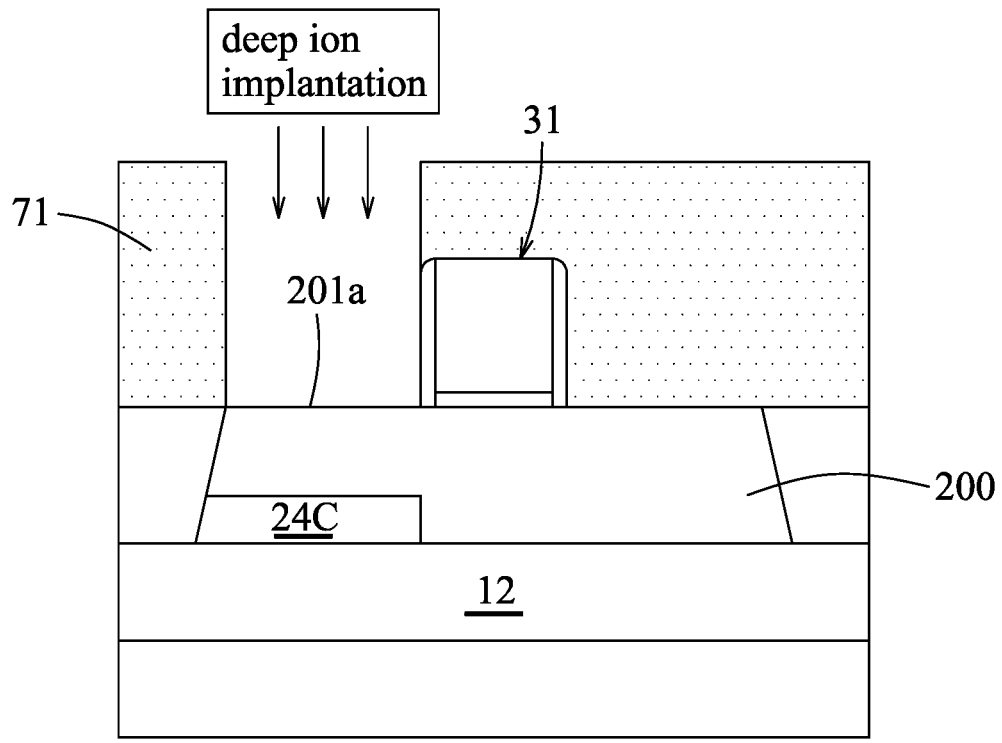
FIGS. 48 and 49 are schematic views illustrating intermediate stages of a method for manufacturing a semiconductor structure in accordance with some embodiments as depicted in FIG. 47.

Referring to FIGS. 47 and 48, the method 700E proceeds to step 802 where a first doping region (corresponding to the butted body 24C of the semiconductor structure 10E) is formed in the semiconductor layer 200 beneath the exposed surface region 201a using a deep ion implantation process. The deep ion implantation process uses the impurity of the second type conductivity (as described above) as a dopant. After step 802, the patterned photoresist 71 may be removed. In alternative embodiments, the first doping region 24C may be formed using, for example, but not limited to, ion species bombardment techniques, or other suitable techniques.

Figure 49:
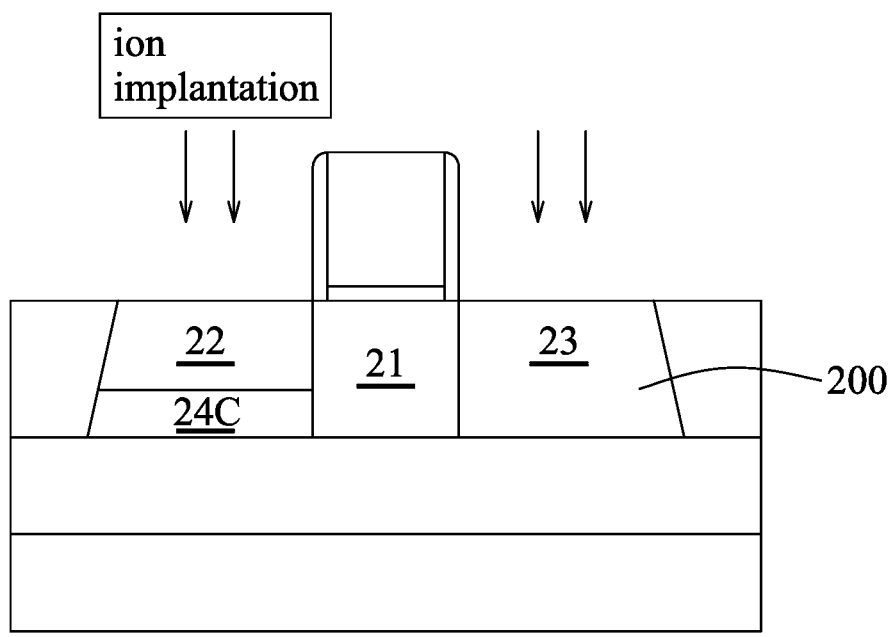

Referring to FIGS. 47 and 49, the method 700E proceeds to step 803 where two second doping regions (corresponding to the active regions 22, 23 of the semiconductor structure 10E) are formed in the semiconductor layer 200 using an ion implantation process. The ion implantation process uses the impurity of the first type conductivity (as described above) as a dopant. In alternative embodiments, the two doping region 22, 23 may be formed using, for example, but not limited to ion species bombardment techniques or other suitable techniques.

After step 705 or step 803 of the method 700E, the semiconductor structure 10E shown in FIG. 7 may be obtained and may be further processed in a manner similar to steps 706 to 711 of the method 700A. In alternative embodiments, other suitable methods may also be applied for forming the semiconductor structure 10E shown in FIG. 7.

The semiconductor structure 10F at an intermediate stage shown in FIG. 8 may be obtained by a method 700F in accordance with some embodiments. The method 700F is similar to the method 700A except for steps 702-705.

Figure 50:
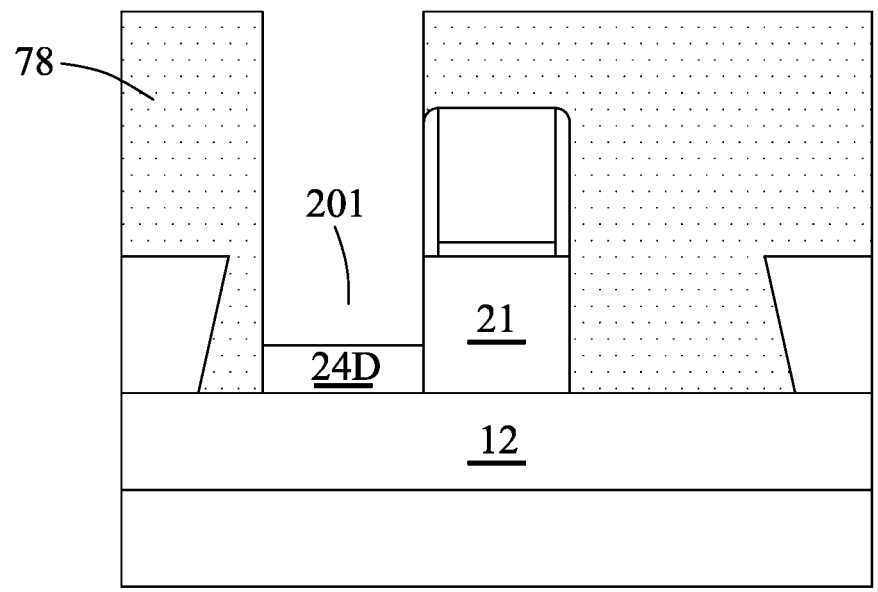
FIG. 50 is a schematic view illustrating an intermediate stage of a method for manufacturing a semiconductor structure in accordance with some embodiments as depicted in FIG. 17.

In some embodiments, referring to FIG. 17, in the method 700F, step 702 may include (i) etching to form the semiconductor structure 100 shown in FIG. 23 using the patterned photoresist 73 (as described above), and (ii) removing the patterned photoresist 73; step 703 may include (i) forming the patterned photoresist 78 on the semiconductor structure 100 to partially expose a bottom of the trench 201 (see FIG. 39; the exposed bottom is distal from the STI region 33), (ii) depositing the butted body 24D on the insulating layer 12 in the trench 201 (see FIG. 50), and (iii) removing the patterned photoresist 78; step 704 may be skipped; and step 705 may be implemented to form respectively in the trenches 201, 202 two semiconductor features which correspond to the active regions 22, 23 of the semiconductor structure 10F shown in FIG. 8. The butted body 24D in step 703 of the method 700F may be deposited using the aforesaid method for forming the butted body 24C in step 703 of the method 700E, and the semiconductor features 22, 23 in step 705 of the method 700F may be formed using the aforesaid method for forming the semiconductor features 22, 23 in step 705 of the method 700A. In some embodiments, the photoresist 73 or 78 may be replaced by a patterned hard mask.

In some embodiments, steps 801-803 shown in FIG. 47 may be used to replace steps 702-705 of the method 700F.

Figure 51:
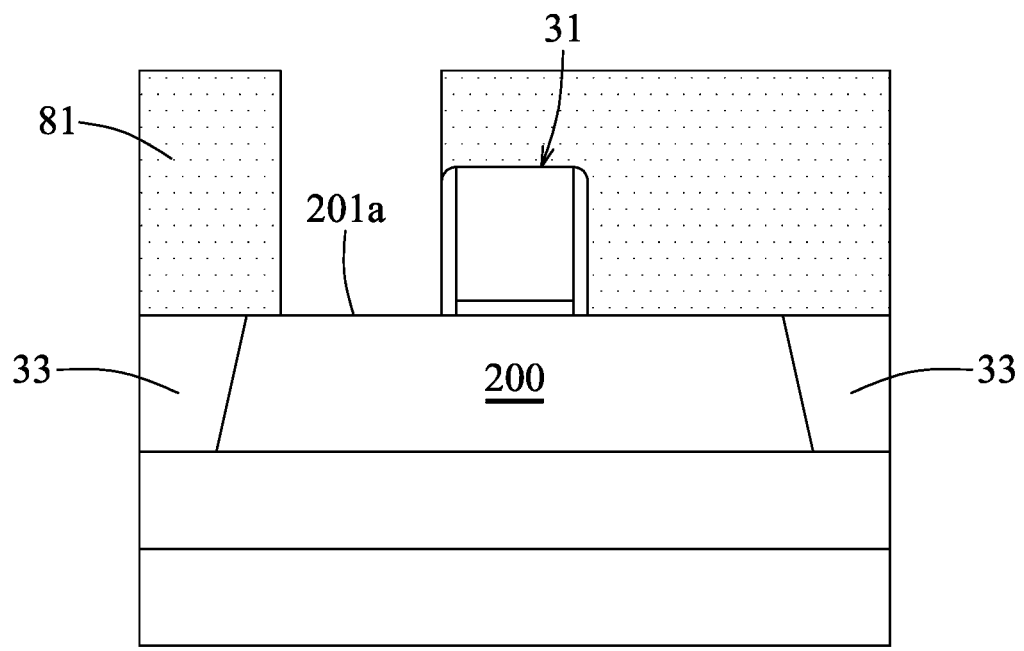
FIGS. 51 to 53 are schematic views illustrating intermediate stages of a method for manufacturing a semiconductor structure in accordance with some embodiments as depicted in FIG. 47.

Referring to FIGS. 47 and 51, the method 700F proceeds to step 801 where a patterned photoresist 81 is formed over the semiconductor structure 100 to partially expose the surface region 201a of the semiconductor layer 200 at one side of the gate stack 31 (as shown in FIG. 51, a part of the surface region 201a in proximity to the STI region 33 may not be exposed). In some embodiments, the patterned photoresist 81 may be replaced with a patterned hard mask.

Figure 52:
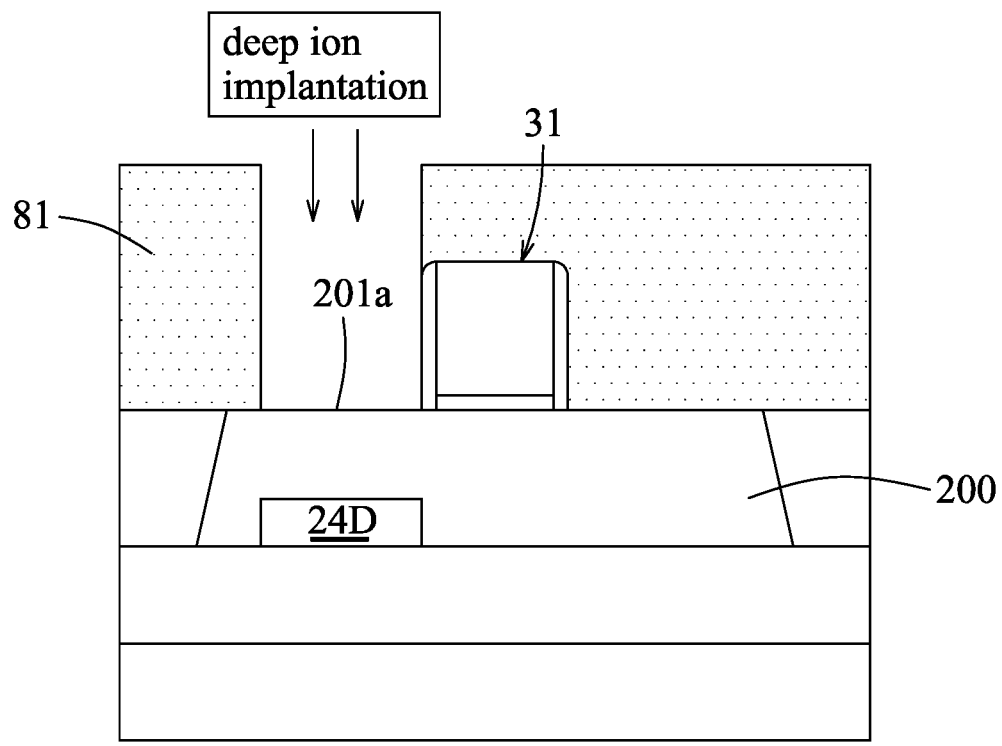

Referring to FIGS. 47 and 52, the method 700F proceeds to step 802 where a first doping region (corresponding to the butted body 24D of the semiconductor structure 10F) is formed in the semiconductor layer 200 beneath the exposed surface region 201a using a deep ion implantation process which is similar to that described in the method 700E. After step 802, the patterned photoresist 81 may be removed.

Figure 53:
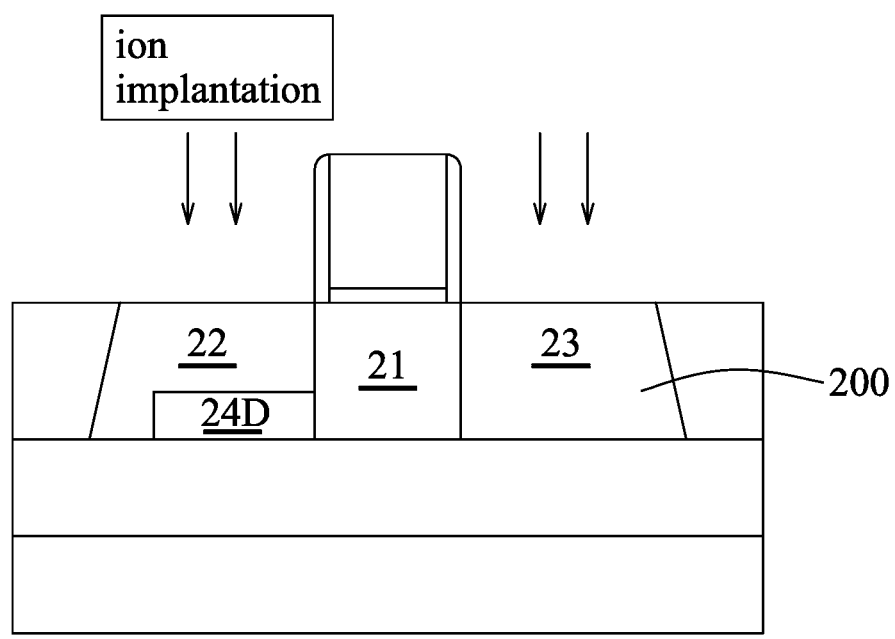

Referring to FIGS. 47 and 53, the method 700F proceeds to step 803 where two second doping regions (corresponding to the active regions 22, 23 of the semiconductor structure 10F) are formed in the semiconductor layer 200 using an ion implantation process which is similar to that described in the method 700E.

After step 705 or step 803 of the method 700F, the semiconductor structure 10F shown in FIG. 8 may be obtained and may be further processed in a manner similar to steps 706 to 711 of the method 700A. In alternative embodiments, other suitable methods may also be applied for forming the semiconductor structure 10F shown in FIG. 8.

The semiconductor structure 10G at an intermediate stage shown in FIG. 9 may be obtained by a method 700G in accordance with some embodiments. The method 700G is similar to the method 700A except for steps 702-705.

Figure 54:
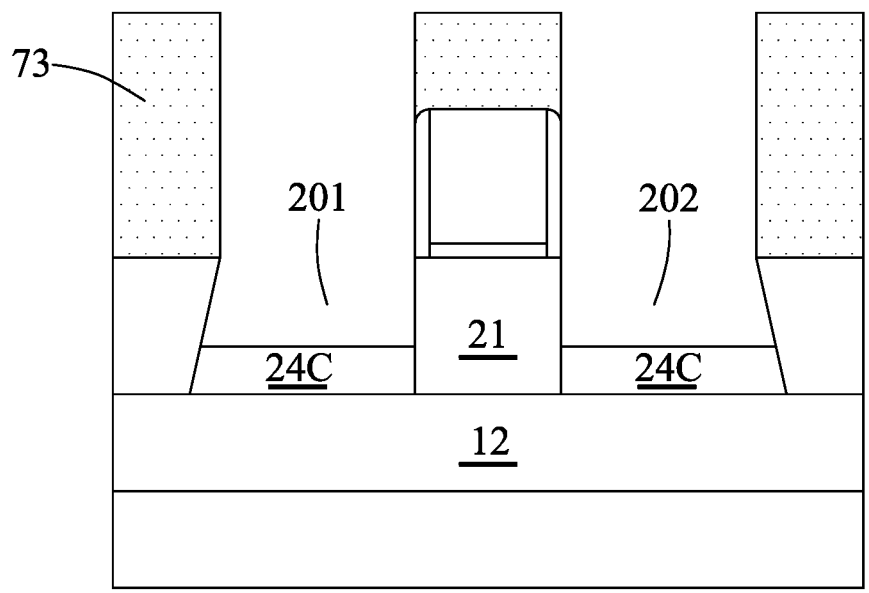
FIG. 54 is a schematic view illustrating an intermediate stage of a method for manufacturing a semiconductor structure in accordance with some embodiments as depicted in FIG. 17.

In some embodiments, referring to FIG. 17, in the method 700G, step 702 may be implemented by etching to form the semiconductor structure 100 shown in FIG. 23 using the patterned photoresist 73 (as described above); step 703 may include (i) depositing two of the butted bodies 24C on the insulating layer 12 respectively in the trenches 201, 202 (see FIG. 54), and (ii) removing the patterned photoresist 73; step 704 may be skipped; and step 705 may be implemented to form respectively in the trenches 201, 202 two semiconductor features which correspond to the active regions 22, 23 of the semiconductor structure 10G shown in FIG. 9. The butted bodies 24C in step 703 of the method 700G may be deposited using the aforesaid method for forming the butted body 24C in step 703 of the method 700E, and the semiconductor features 22, 23 in step 705 of the method 700G may be formed using the aforesaid method for forming semiconductor features 22, 23 in step 705 of the method 700A.

In some embodiments, steps 801-803 shown in FIG. 47 may be used to replace steps 702-705 of the method 700G.

Figure 22:
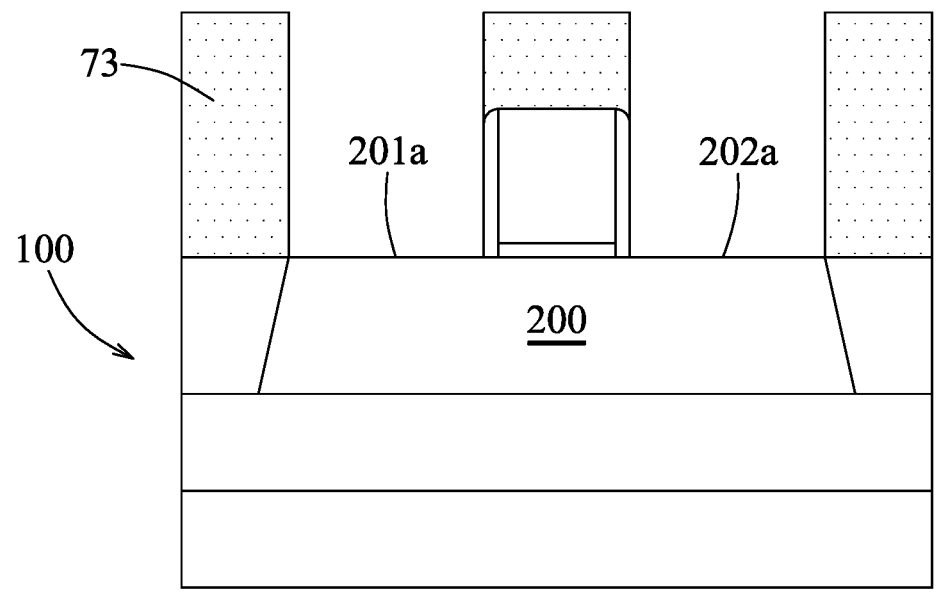

Referring to FIGS. 47 and 22, the method 700G proceeds to step 801 where the patterned photoresist 73 is formed over the semiconductor structure 100 to expose the surface regions 201a, 202a of the semiconductor layer 200.

Figure 55:
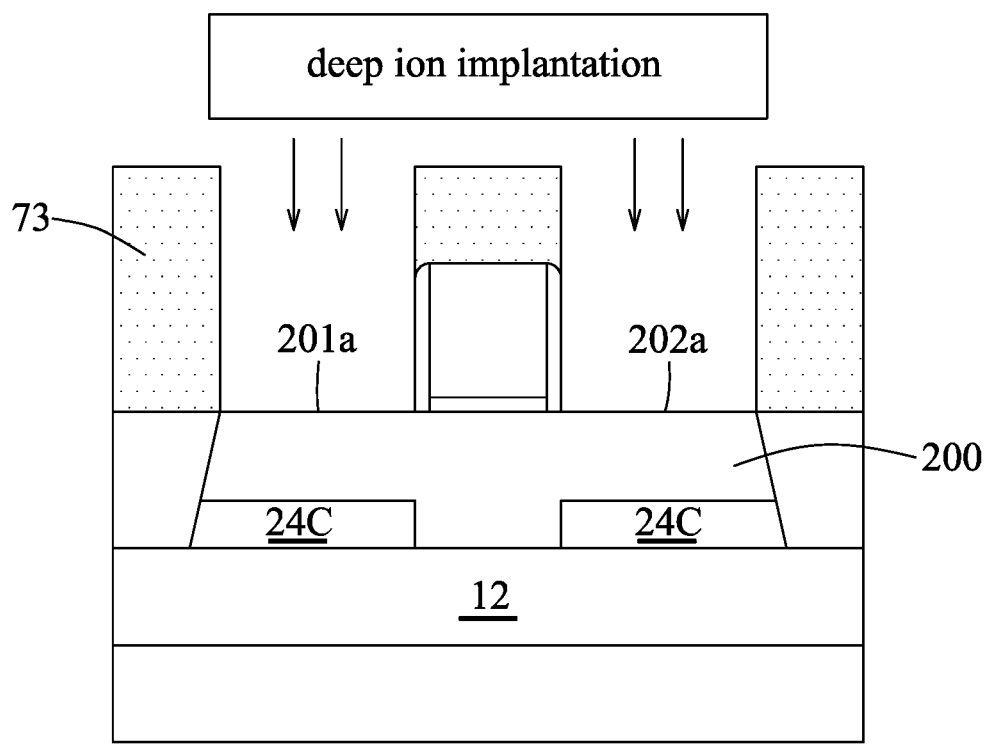
FIGS. 55 and 56 are schematic views illustrating intermediate stages of a method for manufacturing a semiconductor structure in accordance with some embodiments as depicted in FIG. 47.

Referring to FIGS. 47 and 55, the method 700G proceeds to step 802 where two first doping regions (corresponding to the butted bodies 24C of the semiconductor structure 10G) are formed in the semiconductor layer 200 respectively beneath the exposed surface regions 201a, 202a using a deep ion implantation process which is similar to that described in the method 700E. After step 802, the patterned photoresist 73 may be removed.

Figure 56:
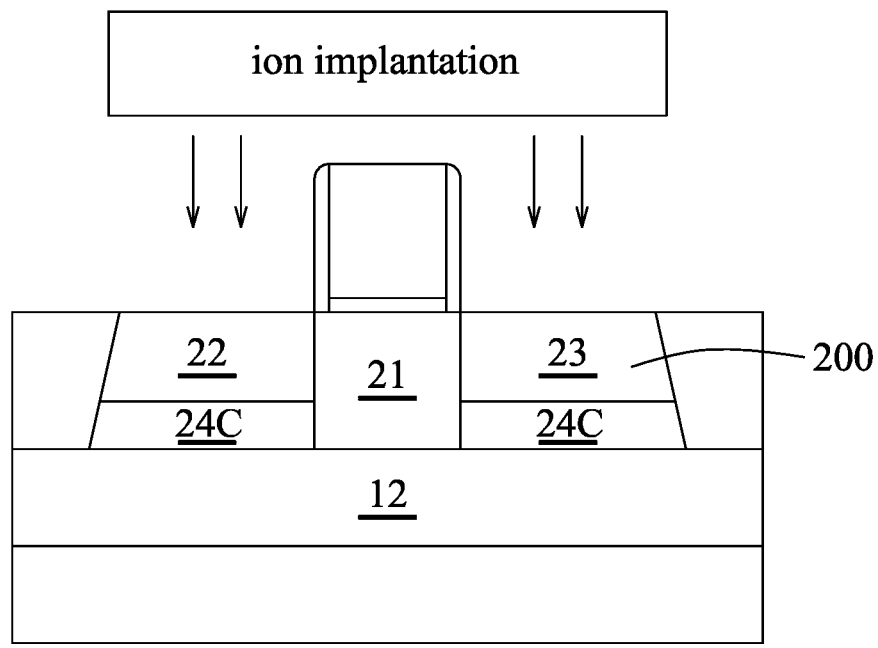

Referring to FIGS. 47 and 56, the method 700G proceeds to step 803 where two second doping regions (corresponding to the active regions 22, 23 of the semiconductor structure 10G) are formed in the semiconductor layer 200 using an ion implantation process which is similar to that described in the method 700E.

After step 705 or step 803 of the method 700G, the semiconductor structure 10G shown in FIG. 9 may be obtained and may be further processed in a manner similar to steps 706 to 711 of the method 700A. In alternative embodiments, other suitable methods may also be applied for forming the semiconductor structure 10G shown in FIG. 9.

The semiconductor structure 10H at an intermediate stage shown in FIG. 10 may be obtained by a method 700H in accordance with some embodiments. The method 700H is similar to the method 700A except for steps 702-705.

Figure 45:
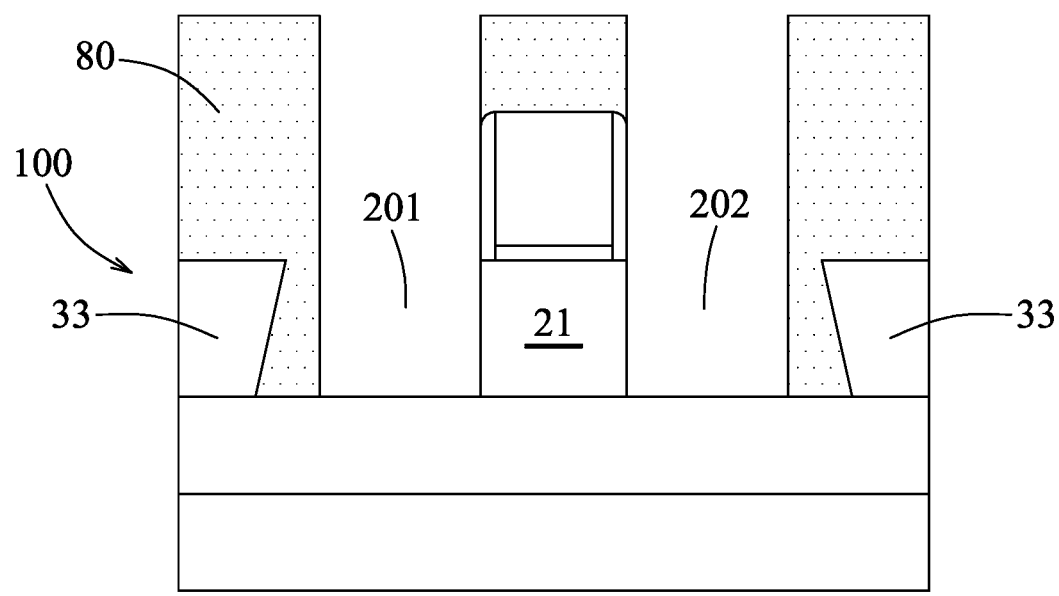
Figure 57:
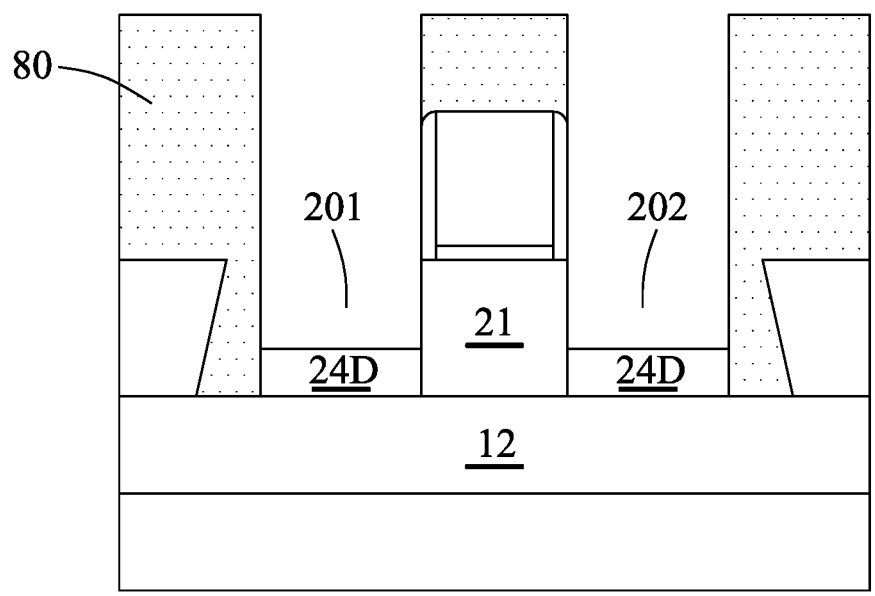
FIG. 57 is a schematic view illustrating an intermediate stage of a method for manufacturing a semiconductor structure in accordance with some embodiments as depicted in FIG. 17.

In some embodiments, referring to FIG. 17, in the method 700H, step 702 may be implemented by etching to form the semiconductor structure 100 shown in FIG. 45 using the patterned photoresist 80 (as described above); step 703 may include (i) depositing two of the butted bodies 24D on the insulating layer 12 respectively in the trenches 201, 202 using the patterned photoresist 80 (see FIG. 57), and (ii) removing the patterned photoresist 80; step 704 may be skipped; and step 705 may be implemented to form respectively in the trenches 201, 202 two semiconductor features which correspond to the active regions 22, 23 of the semiconductor structure 10H shown in FIG. 10. The butted bodies 24D in step 703 of the method 700H may be deposited using the aforesaid method for forming the butted body 24C in step 703 of the method 700E, and the semiconductor features 22, 23 in step 705 of the method 700H may be formed using the aforesaid method for forming the semiconductor features 22, 23 in step 705 of the method 700A.

In some embodiments, steps 801-803 shown in FIG. 47 may be used to replace steps 702-705 of the method 700H.

Figure 58:
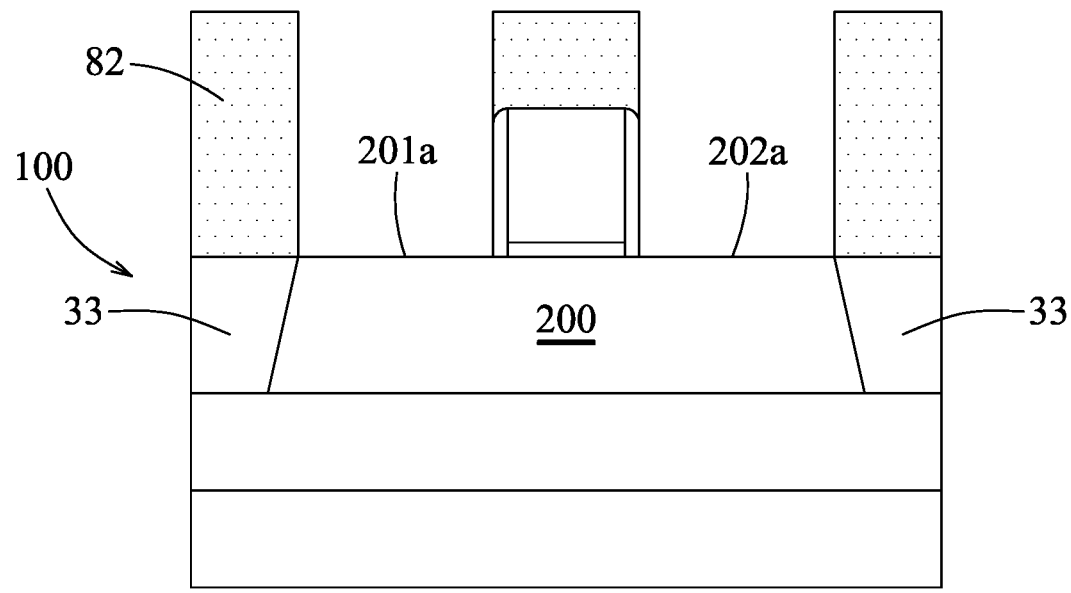
FIGS. 58 to 60 are schematic views illustrating intermediate stages of a method for manufacturing a semiconductor structure in accordance with some embodiments as depicted in FIG. 47.

Referring to FIGS. 47 and 58, the method 700H proceeds to step 801 where a patterned photoresist 82 is formed over the semiconductor structure 100 to partially expose the surface regions 201a, 202a of the semiconductor layer 200 (as shown in FIG. 58, a part of each of the surface regions 201a, 202a in proximity to the STI region 33 may not be exposed).

Figure 59:
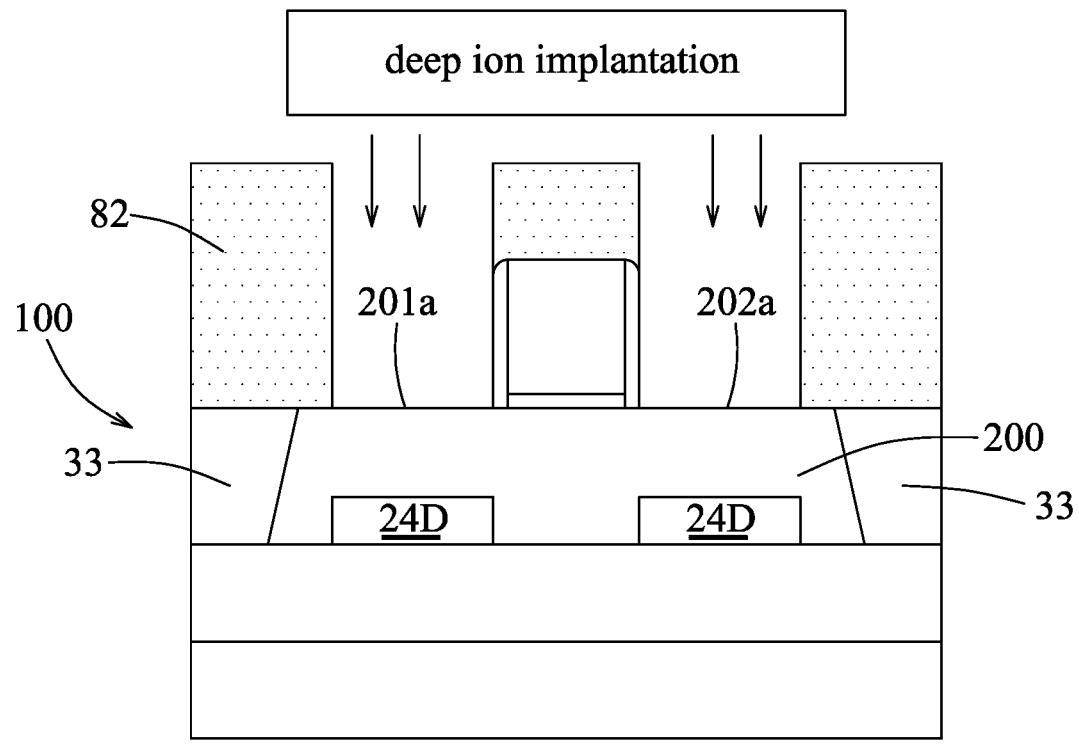

Referring to FIGS. 47 and 59, the method 700H proceeds to step 802 where two of the first doping regions (corresponding to the butted bodies 24D of the semiconductor structure 10H) are formed in the semiconductor layer 200 respectively beneath the partially exposed surface regions 201a, 202a using a deep ion implantation process which is similar to that described in the method 700E. After step 802, the patterned photoresist 82 may be removed.

Figure 60:
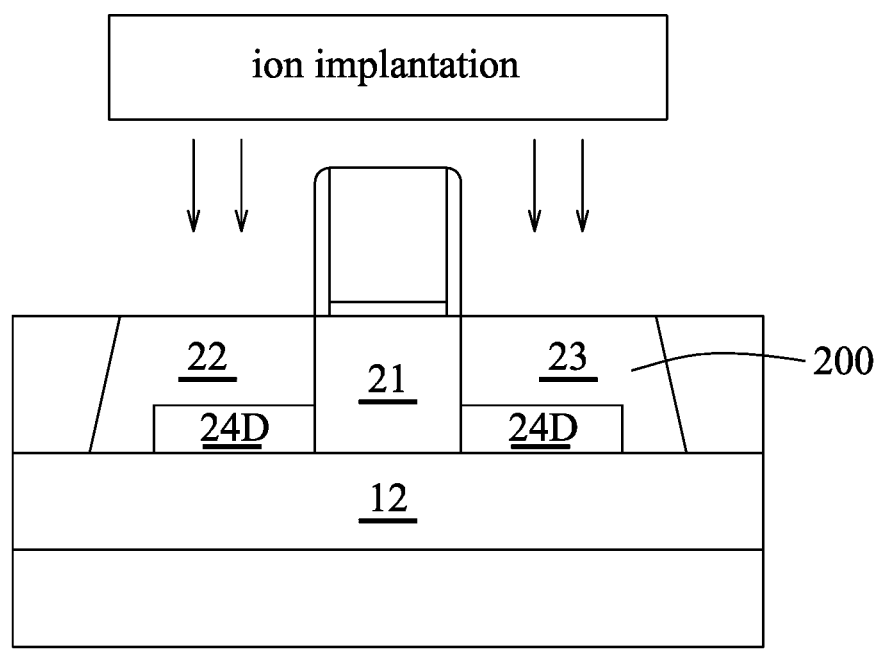

Referring to FIGS. 47 and 60, the method 700H proceeds to step 803 where two second doping regions (corresponding to the active regions 22, 23 of the semiconductor structure 10H) are formed in the semiconductor layer 200 using an ion implantation process which is similar to that described in the method 700E.

After step 705 or step 803 of the method 700H, the semiconductor structure 10H shown in FIG. 10 may be obtained and may be further processed in a manner similar to steps 706 to 711 of the method 700A. In alternative embodiments, other suitable methods may also be applied for forming the semiconductor structure 10H shown in FIG. 10.

With the provision of the butted body (or butted bodies) 24A, 24B, 24C, or 24D in the semiconductor structure of the disclosure, the semiconductor structure of the disclosure is less likely to have a floating body. In addition, because the butted body (or the butted bodies) for tying the body region 21 to the active region(s) 22 and/or 23 may be provided beneath the active region(s) 22 and/or 23, the semiconductor structure of the disclosure may be provided for eliminating the floating body effect without increasing a device area thereof.

In accordance with some embodiments of the present disclosure, a semiconductor structure includes a substrate assembly and a semiconductor device. The semiconductor device is formed on the substrate assembly, and includes a body region, two active regions, and a butted body. The active regions are disposed at two opposite sides of the body region, and both have a first type conductivity. The body region and the active regions together occupy a surface region of the substrate assembly. The butted body has a second type conductivity different from the first type conductivity, and is located on the surface region of the substrate assembly so as to permit the body region to be tied to one of the active regions through the butted body.

In accordance with some embodiments of the present disclosure, a method for manufacturing a semiconductor structure includes steps of: providing a substrate assembly with a semiconductor layer formed thereon; forming two trenches in the semiconductor layer so as to define a body region between the trenches; forming a butted body in one of the trenches; and forming two semiconductor features respectively in the trenches, both the semiconductor features having a conductivity type different from a conductivity type of the butted body so as to permit the body region to be tied to one of the semiconductor features through the butted body.

In accordance with some embodiments of the present disclosure, a method for manufacturing a semiconductor structure includes steps of: providing a substrate assembly with a semiconductor layer formed thereon, the semiconductor layer having two lateral regions and a body region defined between the lateral regions; forming a first doping area in one of the lateral regions; and forming two second doping areas respectively in the lateral regions, the second doping areas having a conductivity type different from a conductivity type of the first doping area so as to permit the body region to be tied to one of the second doping areas through the first doping area.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
a substrate assembly;
a body region disposed on the substrate assembly;
a first active region and a second active region, which are disposed on the substrate assembly and at two opposite sides of the body region, and which have a first conductivity type, the first conductivity type being one of an n-type conductivity and a p-type conductivity;
a first butted body located between the substrate assembly and the first active region, and having a second conductivity type opposite to the first conductivity type, the second conductivity type being the other one of the n-type conductivity and the p-type conductivity; and
an upper buffer layer located between the first butted body and the first active region, the upper buffer layer having an intrinsic conductivity type, and including a lower buffer surface and an upper buffer surface opposite to the lower buffer surface in a first direction, the upper buffer surface being covered by the first active region, the lower buffer surface being in direct contact with the first butted body,
wherein the body region has one of the intrinsic conductivity type and the second conductivity type, and
wherein the first active region is a source region, and the second active region is a drain region.

2. The semiconductor structure of claim 1, wherein:
the substrate assembly includes a substrate and an insulating layer formed on the substrate; and
the first butted body is located between the insulating layer and the upper buffer layer, and is in direct contact with the body region.

3. The semiconductor structure of claim 1, wherein a thickness of the first active region is smaller than a thickness of the body region.

4. The semiconductor structure of claim 1, further comprising
a lower buffer layer located between the substrate assembly and the first butted body, the lower buffer layer having one of the intrinsic conductivity type and the second conductivity type.

5. The semiconductor structure of claim 4, wherein the body region has the intrinsic conductivity type.

6. The semiconductor structure of claim 4, wherein a thickness of a stack composed of the first butted body, the lower buffer layer, and the upper buffer layer ranges from 5% to 50% of a thickness of the body region.

7. The semiconductor structure of claim 1, wherein an upper surface of each of the first active region and the second active region is flush with an upper surface of the body region.

8. The semiconductor structure of claim 1, further comprising
a second butted body located between the substrate assembly and the second active region, the second butted body having the second conductivity type.

9. The semiconductor structure of claim 1, wherein the body region has the second conductivity type, and has a dopant concentration lower than that of the first butted body.

10. The semiconductor structure of claim 1, wherein the first butted body has
a lower surface confronting the substrate assembly,
an upper surface opposite to the lower surface in the first direction, and
two lateral surfaces opposite to each other in a second direction perpendicular to the first direction, each of the two lateral surfaces interconnecting the upper surface and the lower surface, one of the two lateral surfaces being in direct contact with the body region, the other one of the two lateral surfaces being covered by the first active region.

11. The semiconductor structure of claim 4, wherein the first butted body has
a lower surface confronting the substrate assembly,
an upper surface opposite to the lower surface in the first direction, and
two lateral surfaces opposite to each other in a second direction perpendicular to the first direction, each of the two lateral surfaces interconnecting the upper surface and the lower surface, one of the two lateral surfaces being in direct contact with the body region, the other one of the two lateral surfaces being covered by the first active region.

12. The semiconductor structure of claim 1, further comprising
a gate stack disposed on the body region opposite to the substrate assembly.

13. A semiconductor structure comprising:
a substrate assembly;
a body region disposed on the substrate assembly;
a first active region and a second active region, which are disposed on the substrate assembly and at two opposite sides of the body region, and which have a first conductivity type, the first conductivity type being one of an n-type conductivity and a p-type conductivity;
a first butted body located between the substrate assembly and the first active region, and having a second conductivity type opposite to the first conductivity type, the second conductivity type being the other one of the n-type conductivity and the p-type conductivity; and
a lower buffer layer located between the first butted body and the substrate assembly, the lower buffer layer having an intrinsic conductivity type, and including a lower horizontal surface and an upper horizontal surface opposite to the lower horizontal surface in a first direction, the lower horizontal surface being in direct contact with an insulating layer of the substrate assembly, the upper horizontal surface being covered by the butted body,
wherein the body region has one of the intrinsic conductivity type and the second conductivity type, and
wherein the first active region is a source region, and the second active region is a drain region.

14. The semiconductor structure of claim 13, wherein:
the substrate assembly includes a substrate and the insulating layer formed on the substrate;
the lower buffer layer is located between the insulating layer and the first butted body, and is in direct contact with the body region; and
the first butted body is in direct contact with the body region.

15. The semiconductor structure of claim 13, wherein the body region has the intrinsic conductivity type.

16. The semiconductor structure of claim 13, wherein the body region has the second conductivity type, and the body region has a dopant concentration lower than that of the first butted body.

17. A semiconductor structure comprising:
a substrate assembly;
a body region disposed on the substrate assembly;
a first active region and a second active region, which are disposed on the substrate assembly and at two opposite sides of the body region, and which have a first conductivity type, the first conductivity type being one of an n-type conductivity and a p-type conductivity;
a first butted body located between the substrate assembly and the first active region, and having a second conductivity type opposite to the first conductivity type, the second conductivity type being the other one of the n-type conductivity and the p-type conductivity;
a lower buffer layer located between the first butted body and the substrate assembly,
wherein:
both the lower buffer layer and the body region have an intrinsic conductivity type,
each of the lower buffer layer, the first butted body and the body region has a first side surface and a second side surface opposite to the first side surface, each of the first side surface and the second side surface extending in a direction transverse to an upper surface of the substrate assembly,
the first side surface of each of the lower buffer layer and the first butted body is in direct contact with the body region,
the second side surface of each of the lower buffer layer and the first butted body is covered by the first active region, and
the first active region is a source region, and the second active region is a drain region.

18. The semiconductor structure of claim 1, wherein:
the upper buffer layer further includes a first buffer side surface, and a second buffer side surface opposite to the first buffer side surface in a second direction perpendicular to the first direction, each of the first buffer side surface and the second buffer side surface interconnecting the upper buffer surface and the lower buffer surface; and
the first buffer side surface is in direct contact with the body region, and the second buffer side surface is covered by in direct contact with the first active region.

19. The semiconductor structure of claim 13, wherein:
the lower buffer layer further includes a first vertical surface and a second vertical surface opposite to the first vertical surface in a second direction perpendicular to the first direction, each of the first vertical surface and the second vertical surface interconnecting the upper horizontal surface and the lower horizontal surface; and
the first vertical surface is in direct contact with the body region, and the second vertical surface is covered by the first active region.

20. The semiconductor structure of claim 17, wherein each of the first active region and the second active region has the p-type conductivity, and the first butted body has the n-type conductivity.

* * * * *